(12) United States Patent
Bertness

(10) Patent No.: US 7,398,176 B2
(45) Date of Patent: Jul. 8, 2008

(54) BATTERY TESTERS WITH SECONDARY FUNCTIONALITY

(75) Inventor: Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

(21) Appl. No.: 11/352,945

(22) Filed: Feb. 13, 2006

(65) Prior Publication Data

US 2006/0217914 A1 Sep. 28, 2006

Related U.S. Application Data

(60) Continuation-in-part of application No. 10/958,812, filed on Oct. 5, 2004, which is a continuation-in-part of application No. 10/460,749, filed on Jun. 12, 2003, now Pat. No. 6,967,484, which is a continuation-in-part of application No. 10/280,186, filed on Oct. 25, 2002, now Pat. No. 6,759,849, which is a continuation-in-part of application No. 09/816,768, filed on Mar. 23, 2001, now Pat. No. 6,586,941, which is a continuation-in-part of application No. 10/883,019, filed on Jul. 1, 2004, now Pat. No. 6,998,847, which is a division of application No. 10/280,186, filed on Oct. 25, 2002, now Pat. No. 6,759,849, which is a continuation-in-part of application No. 09/816,768, filed on Mar. 23, 2001, now Pat. No. 6,586,941.

(60) Provisional application No. 60/731,881, filed on Oct. 31, 2005, provisional application No. 60/192,222, filed on Mar. 27, 2000.

(51) Int. Cl.
*G06F 19/00* (2006.01)
*G06F 17/40* (2006.01)
*B60C 23/02* (2006.01)
*G01M 17/02* (2006.01)

(52) U.S. Cl. .......... 702/140; 73/146; 73/146.2; 73/146.3; 73/146.4; 73/146.5; 340/436; 340/442; 340/447; 340/449; 702/138

(58) Field of Classification Search .......... 73/146, 73/146.2, 146.3, 146.4, 146.5, 146.8; 340/438, 340/442, 446, 447, 448, 449; 702/138, 140, 702/141, 142, 145

See application file for complete search history.

(56) References Cited

U.S. PATENT DOCUMENTS 2,000,665 A 5/1935 Neal .......... 439/440

(Continued)

FOREIGN PATENT DOCUMENTS

DE 29 26 716 B1 1/1981

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner*—Edward R Cosimano
(74) *Attorney, Agent, or Firm*—Westman, Champlin & Kelly, P.A.

(57) ABSTRACT

An electronic vehicle tester includes a battery tester configured to measure a parameter of a battery of a vehicle. A tire tester is configured to receive a parameter of a tire of the vehicle. A wireless receiver can be configured to receive pressure information from a transmitter associated with a tire of a vehicle.

16 Claims, 5 Drawing Sheets

U.S. PATENT DOCUMENTS

| | | | | |
|---|---|---|---|---|
| 2,417,940 A * | 3/1947 | Lehman | | 200/61.25 |
| 2,514,745 A | 7/1950 | Dalzell | | 324/115 |
| 2,727,221 A * | 12/1955 | Sprigg | | 340/447 |
| 3,178,686 A * | 4/1965 | Mills | | 340/447 |
| 3,223,969 A * | 12/1965 | Course | | 340/447 |
| 3,267,452 A | 8/1966 | Wolf | | 340/249 |
| 3,356,936 A | 12/1967 | Smith | | 324/429 |
| 3,562,634 A | 2/1971 | Latner | | 324/427 |
| 3,593,099 A | 7/1971 | Scholl | | 320/127 |
| 3,607,673 A | 9/1971 | Seyl | | 324/425 |
| 3,652,341 A | 3/1972 | Halsall et al. | | 29/623.2 |
| 3,676,770 A | 7/1972 | Sharaf et al. | | 324/430 |
| 3,729,989 A | 5/1973 | Little | | 73/862.192 |
| 3,750,011 A | 7/1973 | Kreps | | 324/430 |
| 3,753,094 A | 8/1973 | Furuishi et al. | | 324/430 |
| 3,796,124 A | 3/1974 | Crosa | | 411/521 |
| 3,808,522 A | 4/1974 | Sharaf | | 324/430 |
| 3,811,089 A | 5/1974 | Strezelewicz | | 324/170 |
| 3,873,911 A | 3/1975 | Champlin | | 324/430 |
| 3,876,931 A | 4/1975 | Godshalk | | 324/429 |
| 3,886,443 A | 5/1975 | Miyakawa et al. | | 324/426 |
| 3,889,248 A | 6/1975 | Ritter | | 340/636.11 |
| 3,906,329 A | 9/1975 | Bader | | 320/134 |
| 3,909,708 A | 9/1975 | Champlin | | 324/431 |
| 3,936,744 A | 2/1976 | Perlmutter | | 324/772 |
| 3,946,299 A | 3/1976 | Christianson et al. | | 320/430 |
| 3,947,757 A | 3/1976 | Grube et al. | | 324/416 |
| 3,969,667 A | 7/1976 | McWilliams | | 324/427 |
| 3,979,664 A | 9/1976 | Harris | | 324/397 |
| 3,984,762 A | 10/1976 | Dowgiallo, Jr. | | 324/430 |
| 3,984,768 A | 10/1976 | Staples | | 324/712 |
| 3,989,544 A | 11/1976 | Santo | | 429/65 |
| 4,008,619 A | 2/1977 | Alcaide et al. | | 73/724 |
| 4,023,882 A | 5/1977 | Pettersson | | 439/426 |
| 4,024,953 A | 5/1977 | Nailor, III | | 206/344 |
| 4,047,091 A | 9/1977 | Hutchines et al. | | 363/59 |
| 4,053,824 A | 10/1977 | Dupuis et al. | | 324/434 |
| 4,056,764 A | 11/1977 | Endo et al. | | 320/101 |
| 4,070,624 A | 1/1978 | Taylor | | 324/772 |
| 4,086,531 A | 4/1978 | Bernier | | 324/772 |
| 4,106,025 A | 8/1978 | Katz | | 343/715 |
| 4,112,351 A | 9/1978 | Back et al. | | 324/380 |
| 4,114,083 A | 9/1978 | Benham et al. | | 340/636.13 |
| 4,126,874 A | 11/1978 | Suzuki et al. | | 396/301 |
| 4,160,916 A | 7/1979 | Papasideris | | 307/10.6 |
| 4,178,546 A | 12/1979 | Hulls et al. | | 324/772 |
| 4,193,025 A | 3/1980 | Frailing et al. | | 324/427 |
| 4,207,611 A | 6/1980 | Gordon | | 701/33 |
| 4,217,645 A | 8/1980 | Barry et al. | | 702/63 |
| 4,280,457 A | 7/1981 | Bloxham | | 123/198 R |
| 4,297,639 A | 10/1981 | Branham | | 324/429 |
| 4,307,342 A | 12/1981 | Peterson | | 324/767 |
| 4,315,204 A | 2/1982 | Sievers et al. | | 322/28 |
| 4,316,185 A | 2/1982 | Watrous et al. | | 340/636.11 |
| 4,322,685 A | 3/1982 | Frailing et al. | | 324/429 |
| 4,351,405 A | 9/1982 | Fields et al. | | 180/65.2 |
| 4,352,067 A | 9/1982 | Ottone | | 324/434 |
| 4,360,780 A | 11/1982 | Skutch, Jr. | | 324/437 |
| 4,361,809 A | 11/1982 | Bil et al. | | 324/426 |
| 4,363,407 A | 12/1982 | Buckler et al. | | 209/3.3 |
| 4,369,407 A | 1/1983 | Korbell | | 324/416 |
| 4,379,989 A | 4/1983 | Kurz et al. | | 320/165 |
| 4,379,990 A | 4/1983 | Sievers et al. | | 322/99 |
| 4,385,269 A | 5/1983 | Aspinwall et al. | | 320/129 |
| 4,390,828 A | 6/1983 | Converse et al. | | 320/153 |
| 4,392,101 A | 7/1983 | Saar et al. | | 320/156 |
| 4,396,880 A | 8/1983 | Windebank | | 320/156 |
| 4,408,157 A | 10/1983 | Beaubien | | 324/712 |
| 4,412,169 A | 10/1983 | Dell'Orto | | 320/123 |
| 4,423,378 A | 12/1983 | Marino et al. | | 324/427 |
| 4,423,379 A | 12/1983 | Jacobs et al. | | 324/429 |
| 4,424,491 A | 1/1984 | Bobbett et al. | | 324/433 |
| 4,459,548 A | 7/1984 | Lentz et al. | | 324/472 |
| 4,514,694 A | 4/1985 | Finger | | 324/429 |
| 4,520,353 A | 5/1985 | McAuliffe | | 340/636.16 |
| 4,521,498 A | 6/1985 | Juergens | | 429/59 |
| 4,564,798 A | 1/1986 | Young | | 320/103 |
| 4,620,767 A | 11/1986 | Woolf | | 439/217 |
| 4,633,418 A | 12/1986 | Bishop | | 702/63 |
| 4,659,977 A | 4/1987 | Kissel et al. | | 320/150 |
| 4,663,580 A | 5/1987 | Wortman | | 320/153 |
| 4,665,370 A | 5/1987 | Holland | | 324/429 |
| 4,667,143 A | 5/1987 | Cooper et al. | | 320/153 |
| 4,667,279 A | 5/1987 | Maier | | 363/46 |
| 4,678,998 A | 7/1987 | Muramatsu | | 324/427 |
| 4,679,000 A | 7/1987 | Clark | | 324/428 |
| 4,680,528 A | 7/1987 | Mikami et al. | | 320/165 |
| 4,686,442 A | 8/1987 | Radomski | | 320/123 |
| 4,697,134 A | 9/1987 | Burkum et al. | | 320/134 |
| 4,707,795 A | 11/1987 | Alber et al. | | 702/63 |
| 4,709,202 A | 11/1987 | Koenck et al. | | 320/112 |
| 4,710,861 A | 12/1987 | Kanner | | 363/46 |
| 4,719,428 A | 1/1988 | Liebermann | | 324/436 |
| 4,723,656 A | 2/1988 | Kiernan et al. | | 206/705 |
| 4,743,855 A | 5/1988 | Randin et al. | | 324/430 |
| 4,745,349 A | 5/1988 | Palanisamy et al. | | 320/125 |
| 4,773,011 A * | 9/1988 | VanHoose | | 701/30 |
| 4,781,629 A | 11/1988 | Mize | | 439/822 |
| 4,816,768 A | 3/1989 | Champlin | | 324/428 |
| 4,820,966 A | 4/1989 | Fridman | | 320/116 |
| 4,825,170 A | 4/1989 | Champlin | | 324/436 |
| 4,847,547 A | 7/1989 | Eng, Jr. et al. | | 320/153 |
| 4,849,700 A | 7/1989 | Morioka et al. | | 324/427 |
| 4,874,679 A | 10/1989 | Miyagawa | | 429/91 |
| 4,876,495 A | 10/1989 | Palanisamy et al. | | 320/106 |
| 4,881,038 A | 11/1989 | Champlin | | 324/426 |
| 4,888,716 A | 12/1989 | Ueno | | 702/63 |
| 4,907,176 A | 3/1990 | Bahnick et al. | | 364/551.01 |
| 4,912,416 A | 3/1990 | Champlin | | 324/430 |
| 4,913,116 A | 4/1990 | Katogi et al. | | 123/406.32 |
| 4,926,330 A | 5/1990 | Abe et al. | | 701/33 |
| 4,929,931 A | 5/1990 | McCuen | | 340/636.15 |
| 4,931,738 A | 6/1990 | MacIntyre et al. | | 324/435 |
| 4,932,905 A | 6/1990 | Richards | | 439/822 |
| 4,933,845 A | 6/1990 | Hayes | | 710/104 |
| 4,934,957 A | 6/1990 | Bellusci | | 439/504 |
| 4,937,528 A | 6/1990 | Palanisamy | | 324/430 |
| 4,947,124 A | 8/1990 | Hauser | | 324/430 |
| 4,949,046 A | 8/1990 | Seyfang | | 324/427 |
| 4,956,597 A | 9/1990 | Heavey et al. | | 320/129 |
| 4,968,941 A | 11/1990 | Rogers | | 324/428 |
| 4,968,942 A | 11/1990 | Palanisamy | | 324/430 |
| 4,969,834 A | 11/1990 | Johnson | | 439/141 |
| 4,983,086 A | 1/1991 | Hatrock | | 411/259 |
| 5,004,979 A | 4/1991 | Marino et al. | | 324/160 |
| 5,032,825 A | 7/1991 | Kuznicki | | 340/636.15 |
| 5,037,778 A | 8/1991 | Stark et al. | | 228/121 |
| 5,047,722 A | 9/1991 | Wurst et al. | | 324/430 |
| 5,081,565 A | 1/1992 | Nabha et al. | | 362/465 |
| 5,087,881 A | 2/1992 | Peacock | | 324/378 |
| 5,095,223 A | 3/1992 | Thomas | | 307/110 |
| 5,108,320 A | 4/1992 | Kimber | | 439/883 |
| 5,109,213 A * | 4/1992 | Williams | | 340/447 |
| 5,126,675 A | 6/1992 | Yang | | 324/435 |
| 5,130,658 A | 7/1992 | Bohmer | | 324/435 |
| 5,140,269 A | 8/1992 | Champlin | | 324/433 |
| 5,144,218 A | 9/1992 | Bosscha | | 320/139 |
| 5,144,248 A | 9/1992 | Alexandres et al. | | 324/428 |
| 5,159,272 A | 10/1992 | Rao et al. | | 324/429 |
| 5,160,881 A | 11/1992 | Schramm et al. | | 322/7 |
| 5,168,208 A | 12/1992 | Schultz et al. | | 322/25 |
| 5,170,124 A | 12/1992 | Blair et al. | | 324/434 |
| 5,179,335 A | 1/1993 | Nor | | 320/159 |
| 5,194,799 A | 3/1993 | Tomantschger | | 320/103 |

| | | | | | | | |
|---|---|---|---|---|---|---|---|
| 5,204,611 A | 4/1993 | Nor et al. | 320/145 | 5,598,098 A | 1/1997 | Champlin | 324/430 |
| 5,214,370 A | 5/1993 | Harm et al. | 320/152 | 5,602,462 A | 2/1997 | Stich et al. | 323/258 |
| 5,214,385 A | 5/1993 | Gabriel et al. | 324/434 | 5,606,242 A | 2/1997 | Hull et al. | 320/106 |
| 5,241,275 A | 8/1993 | Fang | 324/430 | 5,614,788 A | 3/1997 | Mullins et al. | 315/82 |
| 5,254,952 A | 10/1993 | Salley et al. | 324/429 | 5,621,298 A | 4/1997 | Harvey | 320/134 |
| 5,266,880 A | 11/1993 | Newland | 320/125 | 5,633,985 A | 5/1997 | Severson et al. | 704/267 |
| 5,281,919 A | 1/1994 | Palanisamy | 324/427 | 5,637,978 A | 6/1997 | Kellett et al. | 320/104 |
| 5,281,920 A | 1/1994 | Wurst | 324/430 | 5,642,031 A | 6/1997 | Brotto | 320/156 |
| 5,295,078 A | 3/1994 | Stich et al. | 700/297 | 5,650,937 A | 7/1997 | Bounaga | 702/65 |
| 5,298,797 A | 3/1994 | Redl | 327/387 | 5,652,501 A | 7/1997 | McClure et al. | 340/636.15 |
| 5,300,874 A | 4/1994 | Shimamoto et al. | 320/106 | 5,653,659 A | 8/1997 | Kunibe et al. | 477/111 |
| 5,302,902 A | 4/1994 | Groehl | 324/434 | 5,654,623 A | 8/1997 | Shiga et al. | 320/106 |
| 5,313,152 A | 5/1994 | Wozniak et al. | 320/118 | 5,656,920 A | 8/1997 | Cherng et al. | 324/431 |
| 5,315,287 A | 5/1994 | Sol | 340/455 | 5,661,368 A | 8/1997 | Deol et al. | 315/82 |
| 5,321,626 A | 6/1994 | Palladino | 702/63 | 5,675,234 A | 10/1997 | Greene | 340/636.11 |
| 5,321,627 A | 6/1994 | Reher | 702/63 | 5,677,077 A | 10/1997 | Faulk | 429/90 |
| 5,323,337 A | 6/1994 | Wilson et al. | 702/73 | 5,684,678 A | 11/1997 | Barrett | 363/17 |
| 5,325,041 A | 6/1994 | Briggs | 320/149 | 5,699,050 A | 12/1997 | Kanazawa | 340/636.13 |
| 5,331,268 A | 7/1994 | Patino et al. | 320/158 | 5,701,089 A | 12/1997 | Perkins | 324/772 |
| 5,336,993 A | 8/1994 | Thomas et al. | 324/158.1 | 5,703,464 A * | 12/1997 | Karunasiri et al. | 320/125 |
| 5,338,515 A | 8/1994 | Dalla Betta et al. | 422/95 | 5,705,929 A | 1/1998 | Caravello et al. | 324/430 |
| 5,339,018 A | 8/1994 | Brokaw | 320/147 | 5,707,015 A | 1/1998 | Guthrie | 241/120 |
| 5,343,380 A | 8/1994 | Champlin | 363/46 | 5,710,503 A | 1/1998 | Sideris et al. | 320/116 |
| 5,347,163 A | 9/1994 | Yoshimura | 307/66 | 5,711,648 A | 1/1998 | Hammerslag | 414/800 |
| 5,352,968 A | 10/1994 | Reni et al. | 320/136 | 5,717,336 A | 2/1998 | Basell et al. | 324/430 |
| 5,357,519 A | 10/1994 | Martin et al. | 371/15.1 | 5,717,937 A | 2/1998 | Fritz | 713/300 |
| 5,365,160 A | 11/1994 | Leppo et al. | 320/160 | 5,739,667 A | 4/1998 | Matsuda et al. | 320/128 |
| 5,365,453 A | 11/1994 | Startup et al. | 702/36 | 5,745,044 A | 4/1998 | Hyatt, Jr. et al. | 340/5.23 |
| 5,369,364 A | 11/1994 | Renirie et al. | 324/430 | 5,747,909 A | 5/1998 | Syverson et al. | 310/156.56 |
| 5,381,096 A | 1/1995 | Hirzel | 324/427 | 5,747,967 A | 5/1998 | Muljadi et al. | 320/148 |
| 5,402,007 A | 3/1995 | Center et al. | 290/40 B | 5,754,417 A | 5/1998 | Nicollini | 363/60 |
| 5,410,754 A | 4/1995 | Klotzbach et al. | 370/466 | 5,757,192 A | 5/1998 | McShane et al. | 324/427 |
| 5,412,308 A | 5/1995 | Brown | 323/267 | 5,760,587 A | 6/1998 | Harvey | 324/434 |
| 5,412,323 A | 5/1995 | Kato et al. | 324/429 | 5,772,468 A | 6/1998 | Kowalski et al. | 439/506 |
| 5,425,041 A | 6/1995 | Seko et al. | 372/45.01 | 5,773,978 A | 6/1998 | Becker | 324/430 |
| 5,426,371 A | 6/1995 | Salley et al. | 324/429 | 5,778,326 A * | 7/1998 | Moroto et al. | 701/22 |
| 5,426,416 A | 6/1995 | Jefferies et al. | 340/457 | 5,780,974 A | 7/1998 | Pabla et al. | 315/82 |
| 5,432,025 A | 7/1995 | Cox | 429/65 | 5,780,980 A | 7/1998 | Naito | 318/139 |
| 5,432,426 A | 7/1995 | Yoshida | 320/160 | 5,789,899 A | 8/1998 | van Phuoc et al. | 320/112 |
| 5,434,495 A | 7/1995 | Toko | 320/135 | 5,793,359 A | 8/1998 | Ushikubo | 345/169 |
| 5,435,185 A | 7/1995 | Eagan | 73/587 | 5,796,239 A | 8/1998 | van Phuoc et al. | 320/107 |
| 5,442,274 A | 8/1995 | Tamai | 320/146 | 5,808,469 A | 9/1998 | Kopera | 324/434 |
| 5,445,026 A | 8/1995 | Eagan | 73/591 | 5,811,979 A | 9/1998 | Rhein | 324/718 |
| 5,449,996 A | 9/1995 | Matsumoto et al. | 320/148 | 5,818,234 A | 10/1998 | McKinnon | 324/433 |
| 5,449,997 A | 9/1995 | Gilmore et al. | 320/148 | 5,821,756 A | 10/1998 | McShane et al. | 324/430 |
| 5,451,881 A | 9/1995 | Finger | 324/433 | 5,821,757 A | 10/1998 | Alvarez et al. | 324/434 |
| 5,453,027 A | 9/1995 | Buell et al. | 439/433 | 5,825,174 A | 10/1998 | Parker | 324/106 |
| 5,457,377 A | 10/1995 | Jonsson | 324/430 | 5,831,435 A | 11/1998 | Troy | 324/426 |
| 5,469,043 A | 11/1995 | Cherng et al. | 320/161 | 5,832,396 A * | 11/1998 | Moroto et al. | 701/22 |
| 5,485,090 A | 1/1996 | Stephens | 324/433 | 5,850,113 A | 12/1998 | Weimer et al. | 307/125 |
| 5,488,300 A | 1/1996 | Jamieson | 324/432 | 5,862,515 A | 1/1999 | Kobayashi et al. | 702/63 |
| 5,508,599 A | 4/1996 | Koenck | 320/138 | 5,865,638 A | 2/1999 | Trafton | 439/288 |
| 5,519,383 A | 5/1996 | De La Rosa | 340/636.15 | 5,871,858 A * | 2/1999 | Thomsen et al. | 429/7 |
| 5,528,148 A | 6/1996 | Rogers | 320/137 | 5,872,443 A | 2/1999 | Williamson | 320/160 |
| 5,537,967 A | 7/1996 | Tashiro et al. | 123/192.1 | 5,872,453 A | 2/1999 | Shimoyama et al. | 324/431 |
| 5,541,489 A | 7/1996 | Dunstan | 320/134 | 5,883,306 A * | 3/1999 | Hwang | 73/146.8 |
| 5,546,317 A | 8/1996 | Andrieu | 702/63 | 5,895,440 A | 4/1999 | Proctor et al. | 702/63 |
| 5,548,273 A | 8/1996 | Nicol et al. | 340/439 | 5,903,154 A | 5/1999 | Zhang et al. | 324/437 |
| 5,550,485 A | 8/1996 | Falk | 324/772 | 5,903,716 A | 5/1999 | Kimber et al. | 395/114 |
| 5,561,380 A | 10/1996 | Sway-Tin et al. | 324/509 | 5,912,534 A | 6/1999 | Benedict | 315/82 |
| 5,562,501 A | 10/1996 | Kinoshita et al. | 439/852 | 5,914,605 A | 6/1999 | Bertness | 324/430 |
| 5,563,496 A | 10/1996 | McClure | 320/128 | 5,927,938 A | 7/1999 | Hammerslag | 414/809 |
| 5,572,136 A | 11/1996 | Champlin | 324/426 | 5,929,609 A | 7/1999 | Joy et al. | 322/25 |
| 5,573,611 A * | 11/1996 | Koch et al. | 152/152.1 | 5,939,855 A | 8/1999 | Proctor et al. | 320/104 |
| 5,574,355 A | 11/1996 | McShane et al. | 320/161 | 5,939,861 A | 8/1999 | Joko et al. | 320/122 |
| 5,578,915 A | 11/1996 | Crouch, Jr. et al. | 324/428 | 5,945,829 A | 8/1999 | Bertness | 324/430 |
| 5,583,416 A | 12/1996 | Klang | 320/160 | 5,946,605 A * | 8/1999 | Takahisa et al. | 455/68 |
| 5,585,416 A * | 12/1996 | Audett et al. | 522/35 | 5,951,229 A | 9/1999 | Hammerslag | 414/398 |
| 5,585,728 A | 12/1996 | Champlin | 324/427 | 5,961,561 A | 10/1999 | Wakefield, II | 701/29 |
| 5,589,757 A | 12/1996 | Klang | 320/160 | 5,961,604 A | 10/1999 | Anderson et al. | 709/229 |
| 5,592,093 A | 1/1997 | Klingbiel | 324/426 | 5,969,625 A | 10/1999 | Russo | 340/636.19 |
| 5,592,094 A | 1/1997 | Ichikawa | 324/427 | 5,978,805 A | 11/1999 | Carson | 707/10 |
| 5,596,260 A | 1/1997 | Moravec et al. | 320/135 | 5,982,138 A | 11/1999 | Krieger | 320/105 |

| Patent | Kind | Date | Inventor | Class |
|---|---|---|---|---|
| 6,002,238 | A | 12/1999 | Champlin | 320/134 |
| 6,005,759 | A | 12/1999 | Hart et al. | 361/66 |
| 6,008,652 | A | 12/1999 | Theofanopoulos et al. | 324/434 |
| 6,009,369 | A | 12/1999 | Boisvert et al. | 701/99 |
| 6,016,047 | A | 1/2000 | Notten et al. | 320/137 |
| 6,031,354 | A | 2/2000 | Wiley et al. | 320/116 |
| 6,031,368 | A | 2/2000 | Klippel et al. | 324/133 |
| 6,037,751 | A | 3/2000 | Klang | 320/160 |
| 6,037,777 | A | 3/2000 | Champlin | 324/430 |
| 6,037,778 | A | 3/2000 | Makhija | 324/433 |
| 6,046,514 | A | 4/2000 | Rouillard et al. | 307/77 |
| 6,051,976 | A | 4/2000 | Bertness | 324/426 |
| 6,055,468 | A | 4/2000 | Kaman et al. | 701/29 |
| 6,061,638 | A | 5/2000 | Joyce | 702/63 |
| 6,064,372 | A | 5/2000 | Kahkoska | 345/173 |
| 6,072,299 | A | 6/2000 | Kurle et al. | 320/132 |
| 6,072,300 | A | 6/2000 | Tsuji | 320/116 |
| 6,081,098 | A | 6/2000 | Bertness et al. | 320/134 |
| 6,081,109 | A | 6/2000 | Seymour et al. | 324/127 |
| 6,091,238 | A | 7/2000 | McDermott | 324/207.2 |
| 6,091,245 | A | 7/2000 | Bertness | 324/426 |
| 6,094,031 | A * | 7/2000 | Shimane et al. | 320/118 |
| 6,094,033 | A | 7/2000 | Ding et al. | 320/132 |
| 6,100,670 | A | 8/2000 | Levesque | 320/150 |
| 6,104,167 | A | 8/2000 | Bertness et al. | 320/132 |
| 6,114,834 | A | 9/2000 | Parise | 320/109 |
| 6,137,269 | A | 10/2000 | Champlin | 320/150 |
| 6,140,797 | A | 10/2000 | Dunn | 320/105 |
| 6,144,185 | A | 11/2000 | Dougherty et al. | 320/132 |
| 6,150,793 | A | 11/2000 | Lesesky et al. | 320/104 |
| 6,158,000 | A | 12/2000 | Collins | 713/1 |
| 6,161,640 | A | 12/2000 | Yamaguchi | 180/65.8 |
| 6,163,156 | A | 12/2000 | Bertness | 324/426 |
| 6,167,349 | A | 12/2000 | Alvarez | 702/63 |
| 6,172,483 | B1 | 1/2001 | Champlin | 320/134 |
| 6,172,505 | B1 | 1/2001 | Bertness | 324/430 |
| 6,177,737 | B1 | 1/2001 | Palfey et al. | 307/64 |
| 6,181,545 | B1 | 1/2001 | Amatucci et al. | 361/502 |
| 6,184,656 | B1 * | 2/2001 | Karunasiri et al. | 320/119 |
| 6,211,651 | B1 | 4/2001 | Nemoto | 320/133 |
| 6,215,275 | B1 | 4/2001 | Bean | 320/106 |
| 6,218,936 | B1 * | 4/2001 | Imao | 340/447 |
| 6,222,342 | B1 | 4/2001 | Eggert et al. | 320/105 |
| 6,222,369 | B1 | 4/2001 | Champlin | 324/430 |
| D442,503 | S | 5/2001 | Lundbeck et al. | D10/77 |
| 6,225,808 | B1 | 5/2001 | Varghese et al. | 324/426 |
| 6,236,332 | B1 | 5/2001 | Conkright et al. | 340/3.1 |
| 6,238,253 | B1 | 5/2001 | Qualls | 439/759 |
| 6,242,887 | B1 | 6/2001 | Burke | 320/104 |
| 6,249,124 | B1 | 6/2001 | Bertness | 324/426 |
| 6,250,973 | B1 | 6/2001 | Lowery et al. | 439/754 |
| 6,254,438 | B1 | 7/2001 | Gaunt | 439/755 |
| 6,259,170 | B1 | 7/2001 | Limoge et al. | 307/10.8 |
| 6,259,254 | B1 | 7/2001 | Klang | 324/427 |
| 6,262,563 | B1 | 7/2001 | Champlin | 320/134 |
| 6,263,268 | B1 | 7/2001 | Nathanson | 701/29 |
| 6,271,643 | B1 | 8/2001 | Becker et al. | 320/112 |
| 6,271,748 | B1 * | 8/2001 | Derbyshire et al. | 340/442 |
| 6,275,008 | B1 | 8/2001 | Arai et al. | 320/132 |
| 6,294,896 | B1 | 9/2001 | Champlin | 320/134 |
| 6,294,897 | B1 | 9/2001 | Champlin | 320/153 |
| 6,304,087 | B1 | 10/2001 | Bertness | 324/426 |
| 6,307,349 | B1 | 10/2001 | Koenck et al. | 320/112 |
| 6,310,481 | B2 | 10/2001 | Bertness | 324/430 |
| 6,313,607 | B1 | 11/2001 | Champlin | 320/132 |
| 6,313,608 | B1 | 11/2001 | Varghese et al. | 320/132 |
| 6,316,914 | B1 | 11/2001 | Bertness | 320/134 |
| 6,320,351 | B1 | 11/2001 | Ng et al. | 320/104 |
| 6,323,650 | B1 | 11/2001 | Bertness et al. | 324/426 |
| 6,329,793 | B1 | 12/2001 | Bertness et al. | 320/132 |
| 6,331,762 | B1 | 12/2001 | Bertness | 320/134 |
| 6,332,113 | B1 | 12/2001 | Bertness | 702/63 |
| 6,346,795 | B2 | 2/2002 | Haraguchi et al. | 320/136 |
| 6,347,958 | B1 | 2/2002 | Tsai | 439/488 |
| 6,351,102 | B1 | 2/2002 | Troy | 320/139 |
| 6,356,042 | B1 | 3/2002 | Kahlon et al. | 318/138 |
| 6,359,441 | B1 | 3/2002 | Bertness | 324/426 |
| 6,359,442 | B1 | 3/2002 | Henningson et al. | 324/426 |
| 6,363,303 | B1 | 3/2002 | Bertness | 701/29 |
| RE37,677 | E | 4/2002 | Irie | 315/83 |
| 6,377,031 | B1 * | 4/2002 | Karuppana et al. | 323/220 |
| 6,384,608 | B1 | 5/2002 | Namaky | 324/430 |
| 6,388,448 | B1 | 5/2002 | Cervas | 324/426 |
| 6,392,414 | B2 | 5/2002 | Bertness | 324/429 |
| 6,396,278 | B1 | 5/2002 | Makhija | 324/402 |
| 6,411,098 | B1 | 6/2002 | Laletin | 324/436 |
| 6,417,669 | B1 | 7/2002 | Champlin | 324/426 |
| 6,424,157 | B1 | 7/2002 | Gollomp et al. | 324/430 |
| 6,424,158 | B2 | 7/2002 | Klang | 324/433 |
| 6,437,957 | B1 * | 8/2002 | Karuppana et al. | 361/78 |
| 6,441,585 | B1 | 8/2002 | Bertness | 320/132 |
| 6,445,158 | B1 | 9/2002 | Bertness et al. | 320/104 |
| 6,449,726 | B1 | 9/2002 | Smith | 713/340 |
| 6,456,045 | B1 | 9/2002 | Troy et al. | 320/139 |
| 6,465,908 | B1 * | 10/2002 | Karuppana et al. | 307/31 |
| 6,466,025 | B1 | 10/2002 | Klang | 324/429 |
| 6,466,026 | B1 | 10/2002 | Champlin | 324/430 |
| 6,469,511 | B1 | 10/2002 | Vonderhaar et al. | 324/425 |
| 6,495,990 | B2 | 12/2002 | Champlin | 320/132 |
| 6,497,209 | B1 * | 12/2002 | Karuppana et al. | 123/179.3 |
| 6,505,507 | B1 * | 1/2003 | Imao et al. | 73/146.5 |
| 6,507,196 | B2 * | 1/2003 | Thomsen et al. | 324/436 |
| 6,526,361 | B1 | 2/2003 | Jones et al. | 702/63 |
| 6,529,723 | B1 | 3/2003 | Bentley | 455/405 |
| 6,531,848 | B1 | 3/2003 | Chitsazan et al. | 320/153 |
| 6,534,993 | B2 | 3/2003 | Bertness | 324/433 |
| 6,544,078 | B2 | 4/2003 | Palmisano et al. | 439/762 |
| 6,545,599 | B2 * | 4/2003 | Derbyshire et al. | 340/442 |
| 6,556,019 | B2 | 4/2003 | Bertness | 324/426 |
| 6,566,883 | B1 | 5/2003 | Vonderhaar et al. | 324/426 |
| 6,570,385 | B1 | 5/2003 | Roberts et al. | 324/378 |
| 6,577,107 | B2 | 6/2003 | Kechmire | 320/139 |
| 6,586,941 | B2 | 7/2003 | Bertness et al. | 324/426 |
| 6,597,150 | B1 | 7/2003 | Bertness et al. | 320/104 |
| 6,600,815 | B1 | 7/2003 | Walding | 377/93.07 |
| 6,604,415 | B2 * | 8/2003 | Imao et al. | 73/146.5 |
| 6,618,644 | B2 | 9/2003 | Bean | 700/231 |
| 6,621,272 | B2 | 9/2003 | Champlin | 324/426 |
| 6,623,314 | B1 | 9/2003 | Cox et al. | 439/759 |
| 6,628,011 | B2 | 9/2003 | Droppo et al. | 307/43 |
| 6,629,054 | B2 | 9/2003 | Makhija et al. | 702/113 |
| 6,633,165 | B2 | 10/2003 | Bertness | 324/426 |
| 6,635,974 | B1 * | 10/2003 | Karuppana et al. | 307/140 |
| 6,667,624 | B1 | 12/2003 | Raichle et al. | 324/522 |
| 6,679,212 | B2 | 1/2004 | Kelling | 123/179.28 |
| 6,686,542 | B2 | 2/2004 | Zhang | 174/74 |
| 6,696,819 | B2 | 2/2004 | Bertness | 320/134 |
| 6,707,303 | B2 | 3/2004 | Bertness et al. | 324/426 |
| 6,736,941 | B2 * | 5/2004 | Oku et al. | 203/68 |
| 6,737,831 | B2 | 5/2004 | Champlin | 320/132 |
| 6,738,697 | B2 * | 5/2004 | Breed | 701/29 |
| 6,744,149 | B1 * | 6/2004 | Karuppana et al. | 307/31 |
| 6,759,849 | B2 | 7/2004 | Bertness | 324/426 |
| 6,777,945 | B2 | 8/2004 | Roberts et al. | 324/426 |
| 6,781,382 | B2 | 8/2004 | Johnson | 324/426 |
| 6,784,637 | B2 | 8/2004 | Raichle et al. | 320/107 |
| 6,788,025 | B2 | 9/2004 | Bertness et al. | 320/104 |
| 6,794,993 | B1 * | 9/2004 | Kessler et al. | 340/870.16 |
| 6,795,782 | B2 | 9/2004 | Bertness et al. | 702/63 |
| 6,805,090 | B2 | 10/2004 | Bertness et al. | 123/198 |
| 6,806,716 | B2 | 10/2004 | Bertness et al. | 324/426 |
| 6,825,669 | B2 | 11/2004 | Raichle et al. | 324/426 |
| 6,828,905 | B2 * | 12/2004 | Normann et al. | 340/447 |
| 6,842,707 | B2 | 1/2005 | Raichle et al. | 702/62 |
| 6,850,037 | B2 | 2/2005 | Bertness | 320/132 |
| 6,871,151 | B2 | 3/2005 | Bertness | 702/63 |

| | | | |
|---|---|---|---|
| 6,885,195 B2 | 4/2005 | Bertness | 324/426 |
| 6,888,468 B2 | 5/2005 | Bertness | 340/636.15 |
| 6,891,378 B2 | 5/2005 | Bertness et al. | 324/426 |
| 6,904,796 B2 | 6/2005 | Pacsai et al. | 73/146.8 |
| 6,906,522 B2 | 6/2005 | Bertness et al. | 324/426 |
| 6,906,523 B2 | 6/2005 | Bertness et al. | 324/426 |
| 6,906,624 B2 | 6/2005 | McClelland et al. | 340/442 |
| 6,909,287 B2 | 6/2005 | Bertness | 324/427 |
| 6,913,483 B2 | 7/2005 | Restaino et al. | 439/504 |
| 6,914,413 B2 | 7/2005 | Bertness et al. | 320/104 |
| 6,919,725 B2 | 7/2005 | Bertness et al. | 324/433 |
| 6,930,485 B2 | 8/2005 | Bertness et al. | 324/426 |
| 6,933,727 B2 * | 8/2005 | Bertness et al. | 324/426 |
| 6,941,234 B2 | 9/2005 | Bertness et al. | 702/63 |
| 6,967,484 B2 * | 11/2005 | Bertness | 324/426 |
| 6,972,671 B2 * | 12/2005 | Normann et al. | 340/442 |
| 6,998,847 B2 * | 2/2006 | Bertness et al. | 324/426 |
| 7,003,410 B2 * | 2/2006 | Bertness et al. | 702/63 |
| 7,003,411 B2 * | 2/2006 | Bertness | 702/63 |
| 7,012,433 B2 * | 3/2006 | Smith et al. | 324/426 |
| 7,058,525 B2 * | 6/2006 | Bertness et al. | 702/63 |
| 7,081,755 B2 * | 7/2006 | Klang et al. | 324/426 |
| 7,106,070 B2 * | 9/2006 | Bertness et al. | 324/538 |
| 7,116,109 B2 * | 10/2006 | Klang | 324/426 |
| 7,119,686 B2 * | 10/2006 | Bertness et al. | 340/572.1 |
| 7,126,341 B2 * | 10/2006 | Bertness et al. | 324/426 |
| 7,221,262 B2 * | 5/2007 | Kuchler | 340/426.33 |
| 7,259,684 B1 * | 8/2007 | Manakkal | 340/636.2 |
| 7,266,348 B2 * | 9/2007 | Watabe | 455/67.11 |
| 7,319,380 B2 * | 1/2008 | Schulze et al. | 340/447 |
| 2002/0010558 A1 | 1/2002 | Bertness et al. | 702/63 |
| 2002/0041175 A1 | 4/2002 | Lauper et al. | 320/106 |
| 2002/0044050 A1 * | 4/2002 | Derbyshire et al. | 340/442 |
| 2002/0075146 A1 * | 6/2002 | Saheki | 340/447 |
| 2002/0078740 A1 * | 6/2002 | Imao et al. | 73/146 |
| 2002/0113692 A1 * | 8/2002 | Normann et al. | 340/442 |
| 2002/0130771 A1 * | 9/2002 | Osborne et al. | 340/438 |
| 2002/0171428 A1 | 11/2002 | Bertness | 702/63 |
| 2002/0176010 A1 | 11/2002 | Wallach et al. | 348/362 |
| 2003/0009270 A1 * | 1/2003 | Breed | 701/29 |
| 2003/0025481 A1 | 2/2003 | Bertness | 324/427 |
| 2003/0036909 A1 | 2/2003 | Kato | 704/275 |
| 2003/0088375 A1 | 5/2003 | Bertness et al. | 702/63 |
| 2003/0184262 A1 | 10/2003 | Makhija | 320/156 |
| 2003/0184306 A1 | 10/2003 | Bertness et al. | 324/426 |
| 2003/0187556 A1 * | 10/2003 | Suzuki | 701/29 |
| 2003/0194672 A1 | 10/2003 | Roberts et al. | 431/196 |
| 2003/0214395 A1 * | 11/2003 | Flowerday et al. | 340/445 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0044450 A1 * | 3/2004 | Taguchi et al. | 701/29 |
| 2004/0049361 A1 | 3/2004 | Hamdan et al. | 702/115 |
| 2004/0051533 A1 | 3/2004 | Namaky | 324/426 |
| 2004/0054503 A1 | 3/2004 | Namaky | 702/182 |
| 2004/0055370 A1 * | 3/2004 | Normann et al. | 73/146 |
| 2005/0102073 A1 * | 5/2005 | Ingram, II | 701/29 |
| 2005/0136843 A1 * | 6/2005 | Watabe | 455/67.11 |
| 2005/0190049 A1 * | 9/2005 | Kuchler | 340/445 |
| 2006/0006876 A1 * | 1/2006 | Bertness | 324/426 |
| 2006/0022813 A1 * | 2/2006 | Schulze et al. | 340/442 |
| 2006/0217914 A1 * | 9/2006 | Bertness | 702/113 |

FOREIGN PATENT DOCUMENTS

| | | |
|---|---|---|
| EP | 0 022 450 A1 | 1/1981 |
| EP | 0 637 754 A1 | 2/1995 |
| EP | 0 772 056 A1 | 5/1997 |
| EP | 0 982 159 A2 * | 3/2000 |
| FR | 2 749 397 | 12/1997 |
| GB | 2 029 586 | 3/1980 |
| GB | 2 088 159 A | 6/1982 |
| GB | 2 246 916 A | 10/1990 |
| GB | 2 275 783 A | 7/1994 |
| GB | 2 387 235 A | 10/2003 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 96/06747 A2 * | 3/1996 |
| WO | WO 97/44652 | 11/1997 |
| WO | WO 98/04910 | 2/1998 |
| WO | WO 98/58270 | 12/1998 |
| WO | WO 99/23738 | 5/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |

OTHER PUBLICATIONS

"Battery Impedance", by E. Willihnganz et al., *Electrical Engineering*, Sep. 1959, pp. 922-925.

"Determining The End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477; pp. 128,131.

IEEE Recommended Practice for Maintenance, Testings, and Replacement of Large Lead Storage Batteries for Generating Stations and Substations, *The Institute of Electrical and Electronics Engineers, Inc.*, ANSI/IEEE Std. 450-1987, Mar. 9, 1987, pp. 7-15.

"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.

"JIS Japanese Industrial Standard-Lead Acid Batteries for Automobiles", *Japanese Standards Association UDC*, 621.355.2:629.113. 006, Nov. 1995.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Willihncanz, *The Electrochemical Society*, preprint 79-20, Apr. 1941, pp. 253-258.

National Semiconductor Corporation, "High Q Notch Filter", Mar. 1969, Linear Brief 5.

Burr-Brown Corporation, "Design A 60 Hz Notch Filter with the UAF42", Jan. 1994, AB-071, 1994.

National Semiconductor Corporation, "LMF90-4th-Order Elliptic Notch Filter", Dec. 1994, RRD-B30M115.

"Alligator Clips with Wire Penetrators" *J.S. Popper, Inc.* product information, downloaded form www.jspopper.com/, undated.

"#12: LM78S40 Simple Switcher DC to DC Converter", *ITM e-Catalog*, downloaded form www.pcbcafe.com, undated.

"Simple DC-DC Converts Allows Use of Single Battery", *Electronix Express*, downloaded form www.elexp.com/t_dc-dc.htm, undated.

"DC-DC Converter Basics", *Power Designers*, downloaded from www.powederdesigners.com/InforWeb.design_center/articles/DC-DC/converter.shtm, undated.

"Notification of Transmittal of The International Search Report or the Declaration", PCT/US02/29461.

"Notification of Transmittal of The International Search Report or the Declaration", PCT/US03/07546.

"Notification of Transmittal of The International Search Report or the Declaration", PCT/US03/06577.

"Notification of Transmittal of The International Search Report or the Declaration", PCT/US03/07837.

"Improved Impedance Spectroscopy Technique For Status Determination of Production Li/SO$_2$ Batteries" Terrill Atwater et al., pp. 10-113, (1992).

"Notification of Transmittal of The International Search Report or the Declaration", PCT/US03/41561.

"Notification of Transmittal of The International Search Report or the Declaration", PCT/US03/27696.

"Programming Training Course, 62-000 Series Smart Engine Analyzer", Testproducts Division, Kalamazoo, Michigan, pp. 1-207, (1984).

"Operators Manual, Modular Computer Analyzer Model MCA 3000", Sun Electric Corporation, Crystal Lake, Illinois, pp. 1-1-14-13, (1991).

Notification of Transmittal of the International Search Report for PCT/US03/30707.

"A review of impedance measurements for determination of the state-of-charge or state-of-health of secondary batteries", Journal of Power Sources, pp. 59-69, (1998).

"Search Report Under Section 17" for Great Britain Application No. GB0421447.4.

"Results of Discrete Frequency Immittance Spectroscopy (DFIS) Measurements of Lead Acid Batteries", by K.S. Champlin et al., *Proceedings of 23$^{rd}$ International Teleco Conference (INTELEC)*, published Oct. 2001, IEE, pp. 433-440.

"Examination Report" from the U.K. Patent Office for U.K. App. No. 0417678.0.

Wikipedia Online Encyclopedia, INDUCTANCE, 2005, en.wikipedia.org/wiki/inductance, pp. 1-5, mutual Inductance, pp. 3,4.

"Dynamic modelling of lead/acid batteries using impedance spectroscopy for parameter identification", Journal of Power Sources, pp. 69-84, (1997).

* cited by examiner

BATTERY TESTERS WITH SECONDARY FUNCTIONALITY

CROSS-REFERENCE TO RELATED APPLICATION

The present application is based on and claims the benefit of now expired U.S. provisional patent application Ser. No. 60/731,881, filed Oct. 31, 2005, the present application is also a continuation-in-part and claims priority of pending U.S. Ser. No. 10/958,812, filed Oct. 5, 2004 which is a continuation-in-part of U.S. Ser. No. 10/460,749, filed Jun. 12, 2003, now U.S. Pat. No. 6,967,484 which is a continuation-in-part of U.S. Ser. No. 10/280,186, filed Oct. 25, 2002, now U.S. Pat. No. 6,759,849, which is a continuation-in-part of U.S. Ser. No. 09/816,768, filed Mar. 23, 2001, now U.S. Pat. No. 6,586,941, which claims the benefit of now expired U.S. Provisional Patent Application Ser. No. 60/192,222, filed Mar. 27, 2000; the present application is also a continuation-in-part of U.S. patent application Ser. No. 10/883,019, filed Jul. 1, 2004, now U.S. Pat. No. 6,998,847 which is a divisional of U.S. Ser. No. 10/280,186, filed Oct. 25, 2002, now U.S. Pat. No. 6,759,849, which is a continuation-in-part of U.S. Ser. No. 09/816,768, filed Mar. 23, 2001, now U.S. Pat. No. 6,586,941, which claims the benefit of now expired U.S. Provisional patent application Ser. No. 60/192,222, filed Mar. 27, 2000, the contents of which are hereby incorporated by reference in their entirety.

BACKGROUND OF THE INVENTION

The present invention relates to battery testers. More specifically, the present invention relates to electronic battery testers used for testing storage batteries.

Storage batteries are an important component of modern automotive vehicles. Vehicles with internal combustion engines use such batteries to start the engine or run electrical equipment when the engine is not operating. Electric vehicles use such batteries as a source of power. It is frequently desirable to test storage batteries so that a failing battery can be identified and replaced prior to its ultimate failure, so that a battery with a low state of charge can be recharged, etc. Battery testers are typically limited to a few types of tests.

Many battery-testing techniques have been developed through the years. Midtronics, Inc. of Willowbrook, Illinois and Dr. Keith S. Champlin have been pioneers in battery testing and related technologies. Examples of their work are shown in:

U.S. Pat. No. 3,873,911, issued Mar. 25, 1975, to Champlin, entitled ELECTRONIC BATTERY TESTING DEVICE;

U.S. Pat. No. 3,909,708, issued Sep. 30, 1975, to Champlin, entitled ELECTRONIC BATTERY TESTING DEVICE;

U.S. Pat. No. 4,816,768, issued Mar. 28, 1989, to Champlin, entitled ELECTRONIC BATTERY TESTING DEVICE;

U.S. Pat. No. 4,825,170, issued Apr. 25, 1989, to Champlin, entitled ELECTRONIC BATTERY TESTING DEVICE WITH AUTOMATIC VOLTAGE SCALING;

U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE;

U.S. Pat. No. 4,912,416, issued Mar. 27, 1990, to Champlin, entitled ELECTRONIC BATTERY TESTING DEVICE WITH STATE-OF-CHARGE COMPENSATION;

U.S. Pat. No. 5,140,269, issued Aug. 18, 1992, to Champlin, entitled ELECTRONIC TESTER FOR ASSESSING BATTERY/CELL CAPACITY;

U.S. Pat. No. 5,343,380, issued Aug. 30, 1994, entitled METHOD AND APPARATUS FOR SUPPRESSING TIME-VARYING SIGNALS IN BATTERIES UNDERGOING CHARGING OR DISCHARGING;

U.S. Pat. No. 5,572,136, issued Nov. 5, 1996, entitled ELECTRONIC BATTERY TESTER DEVICE;

U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE;

U.S. Pat. No. 5,583,416, issued Dec. 10, 1996, entitled APPARATUS AND METHOD FOR STEP-CHARGING BATTERIES TO OPTIMIZE CHARGE ACCEPTANCE;

U.S. Pat. No. 5,585,728, issued Dec. 17, 1996, entitled ELECTRONIC BATTERY TESTER WITH AUTOMATIC COMPENSATION FOR LOW STATE-OF-CHARGE;

U.S. Pat. No. 5,589,757, issued Dec. 31, 1996, entitled APPARATUS AND METHOD FOR STEP-CHARGING BATTERIES TO OPTIMIZE CHARGE ACCEPTANCE;

U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT;

U.S. Pat. No. 5,598,098, issued Jan. 28, 1997, entitled ELECTRONIC BATTERY TESTER WITH VERY HIGH NOISE IMMUNITY;

U.S. Pat. No. 5,656,920, issued Aug. 12, 1997, entitled METHOD FOR OPTIMIZING THE CHARGING LEAD-ACID BATTERIES AND AN INTERACTIVE CHARGER;

U.S. Pat. No. 5,757,192, issued May 26, 1998, entitled METHOD AND APPARATUS FOR DETECTING A BAD CELL IN A STORAGE BATTERY;

U.S. Pat. No. 5,821,756, issued Oct. 13, 1998, entitled ELECTRONIC BATTERY TESTER WITH TAILORED COMPENSATION FOR LOW STATE-OF CHARGE;

U.S. Pat. No. 5,831,435, issued Nov. 3, 1998, entitled BATTERY TESTER FOR JIS STANDARD;

U.S. Pat. No. 5,871,858, issued Feb. 16, 1999, entitled ANTI-THEFT BATTERY;

U.S. Pat. No. 5,914,605, issued Jun. 22, 1999, entitled ELECTRONIC BATTERY TESTER;

U.S. Pat. No. 5,945,829, issued Aug. 31, 1999, entitled MIDPOINT BATTERY MONITORING;

U.S. Pat. No. 6,002,238, issued Dec. 14, 1999, entitled METHOD AND APPARATUS FOR MEASURING COMPLEX IMPEDANCE OF CELLS AND BATTERIES;

U.S. Pat. No. 6,037,751, issued Mar. 14, 2000, entitled APPARATUS FOR CHARGING BATTERIES;

U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE;

U.S. Pat. No. 6,051,976, issued Apr. 18, 2000, entitled METHOD AND APPARATUS FOR AUDITING A BATTERY TEST;

U.S. Pat. No. 6,081,098, issued Jun. 27, 2000, entitled METHOD AND APPARATUS FOR CHARGING A BATTERY;

U.S. Pat. No. 6,091,245, issued Jul. 18, 2000, entitled METHOD AND APPARATUS FOR AUDITING A BATTERY TEST;

U.S. Pat. No. 6,104,167, issued Aug. 15, 2000, entitled METHOD AND APPARATUS FOR CHARGING A BATTERY;

U.S. Pat. No. 6,137,269, issued Oct. 24, 2000, entitled METHOD AND APPARATUS FOR ELECTRONICALLY

EVALUATING THE INTERNAL TEMPERATURE OF AN ELECTROCHEMICAL CELL OR BATTERY;

U.S. Pat. No. 6,163,156, issued Dec. 19, 2000, entitled ELECTRICAL CONNECTION FOR ELECTRONIC BATTERY TESTER;

U.S. Pat. No. 6,172,483, issued Jan. 9, 2001, entitled METHOD AND APPARATUS FOR MEASURING COMPLEX IMPEDANCE OF CELLS AND BATTERIES;

U.S. Pat. No. 6,172,505, issued Jan. 9, 2001, entitled ELECTRONIC BATTERY TESTER;

U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE;

U.S. Pat. No. 6,225,808, issued May 1, 2001, entitled TEST COUNTER FOR ELECTRONIC BATTERY TESTER;

U.S. Pat. No. 6,249,124, issued Jun. 19, 2001, entitled ELECTRONIC BATTERY TESTER WITH INTERNAL BATTERY;

U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES;

U.S. Pat. No. 6,262,563, issued Jul. 17, 2001, entitled METHOD AND APPARATUS FOR MEASURING COMPLEX ADMITTANCE OF CELLS AND BATTERIES;

U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT;

U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY;

U.S. Pat. No. 6,304,087, issued Oct. 16, 2001, entitled APPARATUS FOR CALIBRATING ELECTRONIC BATTERY TESTER;

U.S. Pat. No. 6,310,481, issued Oct. 30, 2001, entitled ELECTRONIC BATTERY TESTER;

U.S. Pat. No. 6,313,607, issued Nov. 6, 2001, entitled METHOD AND APPARATUS FOR EVALUATING STORED CHARGE IN AN ELECTROCHEMICAL CELL OR BATTERY;

U.S. Pat. No. 6,313,608, issued Nov. 6, 2001, entitled METHOD AND APPARATUS FOR CHARGING A BATTERY;

U.S. Pat. No. 6,316,914, issued Nov. 13, 2001, entitled TESTING PARALLEL STRINGS OF STORAGE BATTERIES;

U.S. Pat. No. 6,323,650, issued Nov. 27, 2001, entitled ELECTRONIC BATTERY TESTER;

U.S. Pat. No. 6,329,793, issued Dec. 11, 2001, entitled METHOD AND APPARATUS FOR CHARGING A BATTERY;

U.S. Pat. No. 6,331,762, issued Dec. 18, 2001, entitled ENERGY MANAGEMENT SYSTEM FOR AUTOMOTIVE VEHICLE;

U.S. Pat. No. 6,332,113, issued Dec. 18, 2001, entitled ELECTRONIC BATTERY TESTER;

U.S. Pat. No. 6,351,102, issued Feb. 26, 2002, entitled AUTOMOTIVE BATTERY CHARGING SYSTEM TESTER;

U.S. Pat. No. 6,359,441, issued Mar. 19, 2002, entitled ELECTRONIC BATTERY TESTER;

U.S. Pat. No. 6,363,303, issued Mar. 26, 2002, entitled ALTERNATOR DIAGNOSTIC SYSTEM;

U.S. Pat. No. 6,377,031, issued Apr. 23, 2002, entitled INTELLIGENT SWITCH FOR POWER MANAGEMENT;

U.S. Pat. No. 6,392,414, issued May 21, 2002, entitled ELECTRONIC BATTERY TESTER;

U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS;

U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES;

U.S. Pat. No. 6,441,585, issued Aug. 17, 2002, entitled APPARATUS AND METHOD FOR TESTING RECHARGEABLE ENERGY STORAGE BATTERIES;

U.S. Pat. No. 6,437,957, issued Aug. 20, 2002, entitled SYSTEM AND METHOD FOR PROVIDING SURGE, SHORT, AND REVERSE POLARITY CONNECTION PROTECTION;

U.S. Pat. No. 6,445,158, issued Sep. 3, 2002, entitled VEHICLE ELECTRICAL SYSTEM TESTER WITH ENCODED OUTPUT;

U.S. Pat. No. 6,456,045, issued Sep. 24, 2002, entitled INTEGRATED CONDUCTANCE AND LOAD TEST BASED ELECTRONIC BATTERY TESTER;

U.S. Pat. No. 6,466,025, issued Oct. 15, 2002, entitled ALTERNATOR TESTER;

U.S. Pat. No. 6,465,908, issued Oct. 15, 2002, entitled INTELLIGENT POWER MANAGEMENT SYSTEM;

U.S. Pat. No. 6,466,026, issued Oct. 15, 2002, entitled PROGRAMMABLE CURRENT EXCITER FOR MEASURING AC IMMITTANCE OF CELLS AND BATTERIES;

U.S. Pat. No. 6,469,511, issued Nov. 22, 2002, entitled BATTERY CLAMP WITH EMBEDDED ENVIRONMENT SENSOR;

U.S. Pat. No. 6,495,990, issued Dec. 17, 2002, entitled METHOD AND APPARATUS FOR EVALUATING STORED CHARGE IN AN ELECTROCHEMICAL CELL OR BATTERY;

U.S. Pat. No. 6,497,209, issued Dec. 24, 2002, entitled SYSTEM AND METHOD FOR PROTECTING A CRANKING SUBSYSTEM;

U.S. Pat. No. 6,507,196, issued Jan. 14, 2003; entitled BATTERY HAVING DISCHARGE STATE INDICATION;

U.S. Pat. No. 6,534,993, issued Mar. 18, 2003, entitled ELECTRONIC BATTERY TESTER;

U.S. Pat. No. 6,544,078, issued Apr. 8, 2003, entitled BATTERY CLAMP WITH INTEGRATED CURRENT SENSOR;

U.S. Pat. No. 6,556,019, issued Apr. 29, 2003, entitled ELECTRONIC BATTERY TESTER;

U.S. Pat. No. 6,566,883, issued May 20, 2003, entitled ELECTRONIC BATTERY TESTER;

U.S. Pat. No. 6,586,941, issued Jul. 1, 2003, entitled BATTERY TESTER WITH DATABUS;

U.S. Pat. No. 6,597,150, issued Jul. 22, 2003, entitled METHOD OF DISTRIBUTING JUMP-START BOOSTER PACKS;

U.S. Pat. No. 6,621,272, issued Sep. 16, 2003, entitled PROGRAMMABLE CURRENT EXCITER FOR MEASURING AC IMMITTANCE OF CELLS AND BATTERIES;

U.S. Pat. No. 6,623,314, issued Sep. 23, 2003, entitled KELVIN CLAMP FOR ELECTRICALLY COUPLING TO A BATTERY CONTACT;

U.S. Pat. No. 6,633,165, issued Oct. 14, 2003, entitled IN-VEHICLE BATTERY MONITOR;

U.S. Pat. No. 6,635,974, issued Oct. 21, 2003, entitled SELF-LEARNING POWER MANAGEMENT SYSTEM AND METHOD;

U.S. Pat. No. 6,696,819, Feb. 24, 2004, entitled BATTERY CHARGE CONTROL DEVICE:

U.S. Pat. No. 6,707,303, issued Mar. 16, 2004, entitled ELECTRONIC BATTERY TESTER;

U.S. Pat. No. 6,737,831, issued May 18, 2004, entitled METHOD AND APPARATUS USING A CIRCUIT MODEL TO EVALUATE CELL/BATTERY PARAMETERS;

U.S. Pat. No. 6,744,149, issued Jun. 1, 2004, entitled SYSTEM AND METHOD FOR PROVIDING STEP-DOWN POWER CONVERSION USING AN INTELLIGENT SWITCH;

U.S. Pat. No. 6,759,849, issued Jul. 6, 2004, entitled BATTERY TESTER CONFIGURED TO RECEIVE A REMOVABLE DIGITAL MODULE;

U.S. Pat. No. 6,781,382, issued Aug. 24, 2004, entitled ELECTRONIC BATTERY TESTER;

U.S. Pat. No. 6,788,025, filed Sep. 7, 2004, entitled BATTERY CHARGER WITH BOOSTER PACK;

U.S. Pat. No. 6,795,782, issued Sep. 21, 2004, entitled BATTERY TEST MODULE;

U.S. Pat. No. 6,805,090, filed Oct. 19, 2004, entitled CHARGE CONTROL SYSTEM FOR A VEHICLE BATTERY;

U.S. Pat. No. 6,806,716, filed Oct. 19, 2004, entitled ELECTRONIC BATTERY TESTER;

U.S. Pat. No. 6,850,037, filed Feb. 1, 2005, entitled IN-VEHICLE BATTERY MONITORING;

U.S. Pat. No. 6,871,151, issued Mar. 22, 2005, entitled ELECTRONIC BATTERY TESTER WITH NETWORK COMMUNICATION;

U.S. Pat. No. 6,885,195, issued Apr. 26, 2005, entitled METHOD AND APPARATUS FOR AUDITING A BATTERY TEST;

U.S. Pat. No. 6,888,468, issued May 3, 2005, entitled APPARATUS AND METHOD FOR PROTECTING A BATTERY FROM OVERDISCHARGE;

U.S. Pat. No. 6,891,378, issued May 10, 2005, entitled ELECTRONIC BATTERY TESTER;

U.S. Pat. No. 6,906,522, issued Jun. 14, 2005, entitled BATTERY TESTER WITH BATTERY REPLACEMENT OUTPUT;

U.S. Pat. No. 6,906,523, issued Jun. 14, 2005, entitled METHOD AND APPARATUS FOR TESTING CELLS AND BATTERIES EMBEDDED IN SERIES/PARALLEL SYSTEMS;

U.S. Pat. No. 6,909,287, issued Jun. 21, 2005, entitled ENERGY MANAGEMENT SYSTEM WITH AUTOMOTIVE VEHICLE;

U.S. Pat. No. 6,914,413, issued Jul. 5, 2005, entitled ALTERNATOR TESTER WITH ENCODED OUTPUT;

U.S. Pat. No. 6,913,483, issued Jul. 5, 2005, entitled CABLE FOR ELECTRONIC BATTERY TESTER;

U.S. Pat. No. 6,930,485, issued Aug. 16, 2005, entitled ELECTRONIC BATTERY TESTER WITH BATTERY FAILURE TEMPERATURE DETERMINATION;

U.S. Pat. No. 6,933,727, issued Aug. 23, 2005, entitled ELECTRONIC BATTERY TESTER CABLE;

U.S. Pat. No. 6,941,234, filed Sep. 6, 2005, entitled QUERY BASED ELECTRONIC BATTERY TESTER;

U.S. Pat. No. 6,967,484, issued Nov. 22, 2005, entitled MODULAR BATTERY TESTER FOR SCAN TOOL;

U.S. Pat. No. 6,998,847, issued Feb. 14, 2006, entitled ELECTRONIC BATTERY TESTER WITH DATA BUS FOR REMOVABLE MODULE;

U.S. Pat. No. 7,003,410, issued Feb. 21, 2006, entitled ELECTRONIC BATTERY TESTER WITH RELATIVE TEST OUTPUT;

U.S. Pat. No. 7,003,411, issued Feb. 21, 2006, entitled ELECTRONIC BATTERY TESTER WITH NETWORK COMMUNICATION;

U.S. Pat. No. 7,012,433, issued Mar. 14, 2006, entitled BATTERY TESTER UPGRADE USING SOFTWARE KEY;

U.S. Pat. No. 7,034,541, issued Apr. 25, 2006, entitled QUERY BASED ELECTRONIC BATTERY TESTER;

U.S. Pat. No. 7,058,525, issued Jun. 6, 2006, entitled BATTERY TEST MODULE;

U.S. Pat. No. 7,081,255, issued Jul. 25, 2006, entitled BATTERY TESTER CAPABLE OF PREDICTING A DISCHARGE VOLTAGE/DISCHARGE CURRENT OF A BATTERY;

U.S. Pat. No. 7,106,070, issued Sep. 12, 2006, entitled BROAD-BAND LOW-INDUCTANCE CABLES FOR MAKING KELVIN CONNECTIONS TO ELECTROCHEMICAL CELLS AND BATTERIES;

U.S. Pat. No. 7,116,109, issued Oct. 3, 2006, entitled APPARATUS AND METHOD FOR SIMULATING A BATTERY TESTER WITH A FIXED RESISTANCE LOAD;

U.S. Pat. No. 7,119,686, issued Oct. 10, 2006, entitled THEFT PREVENTION DEVICE FOR AUTOMOTIVE VEHICLE SERVICE CENTERS;

U.S. Pat. No. 7,126,341, issued Oct. 24, 2006, entitled AUTOMOTIVE VEHICLE ELECTRICAL SYSTEM DIAGNOSTIC DEVICE;

U.S. Pat. No. 7,154,276, issued Dec. 26, 2006, entitled METHOD AND APPARATUS FOR MEASURING A PARAMETER OF A VEHICLE ELECTRICAL SYSTEM;

U.S. Pat. No. 7,198,510, issued Apr. 3, 2007, entitled KELVIN CONNECTOR FOR A BATTERY POST;

U.S. Pat. No. 7,208,914, issued Apr. 24, 2007, entitled APPARATUS AND METHOD FOR PREDICTING THE REMAINING DISCHARGE TIME OF A BATTERY;

U.S. Pat. No. 7,246,015, issued Jul. 17, 2007, entitled ALTERNATOR TESTER;

U.S. Ser. No. 09/780,146, filed Feb. 9, 2001, entitled STORAGE BATTERY WITH INTEGRAL BATTERY TESTER, now abandoned;

U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE, now abandoned;

U.S. Ser. No. 09/862,783, filed May 21, 2001, entitled METHOD AND APPARATUS FOR TESTING CELLS AND BATTERIES EMBEDDED IN SERIES/PARALLEL SYSTEMS, now abandoned;

U.S. Ser. No. 09/880,473, filed Jun. 13, 2001; entitled BATTERY TEST MODULE, now abandoned;

U.S. Ser. No. 10/109,734, filed Mar. 28, 2002, entitled APPARATUS AND METHOD FOR COUNTERACTING SELF DISCHARGE IN A STORAGE BATTERY, now abandoned;

U.S. Ser. No. 10/263,473, filed Oct. 2, 2002, entitled ELECTRONIC BATTERY TESTER WITH RELATIVE TEST OUTPUT, now abandoned;

U.S. Ser. No. 10/462,323, filed Jun. 16, 2003, entitled ELECTRONIC BATTERY TESTER HAVING A USER INTERFACE TO CONFIGURE A PRINTER, now pending;

U.S. Ser. No. 10/653,342, filed Sep. 2, 2003, entitled ELECTRONIC BATTERY TESTER CONFIGURED TO PREDICT A LOAD TEST RESULT ELECTRONIC BATTERY TESTER CONFIGURED TO PREDICT A LOAD TEST RESULT BASED ON OPEN CIRCUIT VOLTAGE, TEMPERATURE, CRANKING SIZE RATING, AND A DYNAMIC PARAMETER, now pending;

U.S. Ser. No. 10/441,271, filed May 19, 2003, entitled ELECTRONIC BATTERY TESTER, now pending;

U.S. Ser. No. 09/653,963, filed Sep. 1, 2000, entitled SYSTEM AND METHOD FOR CONTROLLING POWER GENERATION AND STORAGE, now abandoned;

U.S. Ser. No. 10/174,110, filed Jun. 18, 2002, entitled DAYTIME RUNNING LIGHT CONTROL USING AN INTELLIGENT POWER MANAGEMENT SYSTEM, now abandoned;

U.S. Ser. No. 10/258,441, filed Apr. 9, 2003, entitled CURRENT MEASURING CIRCUIT SUITED FOR BATTERIES, now abandoned;

U.S. Ser. No. 10/681,666, filed Oct. 8, 2003, entitled ELECTRONIC BATTERY TESTER WITH PROBE LIGHT, now pending;

U.S. Ser. No. 10/783,682, filed Feb. 20, 2004, entitled REPLACEABLE CLAMP FOR ELECTRONIC BATTERY TESTER, now pending;

U.S. Ser. No. 10/791,141, filed Mar. 2, 2004, entitled AUTOMOTIVE BATTERY CHARGING SYSTEM TESTER, now pending;

U.S. Ser. No. 10/867,385, filed Jun. 14, 2004, entitled ENERGY MANAGEMENT SYSTEM FOR AUTOMOTIVE VEHICLE, now pending;

U.S. Ser. No. 10/896,834, filed Jul. 22, 2004, entitled ELECTRONIC BATTERY TESTER, now pending;

U.S. Ser. No. 10/897,801, filed Jul. 23, 2004, entitled SHUNT CONNECTION TO A PCB FOR AN ENERGY MANAGEMENT SYSTEM EMPLOYED IN AN AUTOMOTIVE VEHICLES, now pending;

U.S. Ser. No. 10/958,821, filed Oct. 5, 2004, entitled IN-VEHICLE BATTERY MONITOR, now pending;

U.S. Ser. No. 10/958,812, filed Oct. 5, 2004, entitled SCAN TOOL FOR ELECTRONIC BATTERY TESTER, now pending;

U.S. Ser. No. 11/008,456, filed Dec. 9, 2004, entitled APPARATUS AND METHOD FOR PREDICTING BATTERY CAPACITY AND FITNESS FOR SERVICE FROM A BATTERY DYNAMIC PARAMETER AND A RECOVERY VOLTAGE DIFFERENTIAL, now pending;

U.S. Ser. No. 60/587,232, filed Dec. 14, 2004, entitled CELLTRON ULTRA, now expired;

U.S. Ser. No. 11/018,785, filed Dec. 21, 2004, entitled WIRELESS BATTERY MONITOR, now pending;

U.S. Ser. No. 60/653,537, filed Feb. 16, 2005, entitled CUSTOMER MANAGED WARRANTY CODE, now expired;

U.S. Ser. No. 11/063,247, filed Feb. 22, 2005, entitled ELECTRONIC BATTERY TESTER OR CHARGER WITH DATABUS CONNECTION, now pending;

U.S. Ser. No. 60/665,070, filed Mar. 24, 2005, entitled OHMMETER PROTECTION CIRCUIT, now expired;

U.S. Ser. No. 11/141,234, filed May 31, 2005, entitled BATTERY TESTER CAPABLE OF IDENTIFYING FAULTY BATTERY POST ADAPTERS, now pending;

U.S. Ser. No. 11/143,828, filed Jun. 2, 2005, entitled BATTERY TEST MODULE, now pending;

U.S. Ser. No. 11/146,608, filed Jun. 7, 2005, entitled SCAN TOOL FOR ELECTRONIC BATTERY TESTERS, now pending;

U.S. Ser. No. 60/694,199, filed Jun. 27, 2005, entitled GEL BATTERY CONDUCTANCE COMPENSATION, now expired;

U.S. Ser. No. 11/178,550, filed Jul. 11, 2005, entitled WIRELESS BATTERY TESTER/CHARGER, now pending;

U.S. Ser. No. 60/705,389, filed Aug. 4, 2005, entitled PORTABLE TOOL THEFT PREVENTION SYSTEM, now expired;

U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, now pending;

U.S. Ser. No. 60/712,322, filed Aug. 29, 2005, entitled AUTOMOTIVE VEHICLE ELECTRICAL SYSTEM DIAGNOSTIC DEVICE, now expired;

U.S. Ser. No. 60/713,168, filed Aug. 31, 2005, entitled LOAD TESTER SIMULATION WITH DISCHARGE COMPENSATION, now expired;

U.S. Ser. No. 60/731,881, filed Oct. 31, 2005, entitled PLUG-IN FEATURES FOR BATTERY TESTERS, now expired;

U.S. Ser. No. 60/731,887, filed Oct. 31, 2005, entitled AUTOMOTIVE VEHICLE ELECTRICAL SYSTEM DIAGNOSTIC DEVICE, now expired;

U.S. Ser. No. 11/304,004, filed Dec. 14, 2005, entitled BATTERY TESTER THAT CALCULATES ITS OWN REFERENCE VALUES, now pending; and U.S. Ser. No. 60/751,853, filed Dec. 20, 2005, entitled BATTERY MONITORING SYSTEM, now expired; which are incorporated herein in their entirety.

SUMMARY OF THE INVENTION

An electronic vehicle tester includes a battery tester configured to measure a parameter of a battery of a vehicle. A tire tester is configured to receive a parameter of a tire of the vehicle. A wireless receiver can be configured to receive pressure information from a transmitter associated with a tire of a vehicle.

DETAILED DESCRIPTION OF THE PREFERRED EMBODIMENTS

The present invention provides an electronic battery tester for testing storage batteries in which removable modules can be selectively coupled to the electronic battery tester to extend the functionality of the device. In one configuration, the additional functionality is built into the device and is not carried in a removable module. In various aspects, the invention includes an electronic battery tester adapted to couple to a removable module, a removable module itself and a combination of an electronic battery tester and a removable module. The following is a more detailed description of the invention. However, in broad aspects, the present invention is not limited to the specific configurations or example modules set forth herein.

Figure 1:
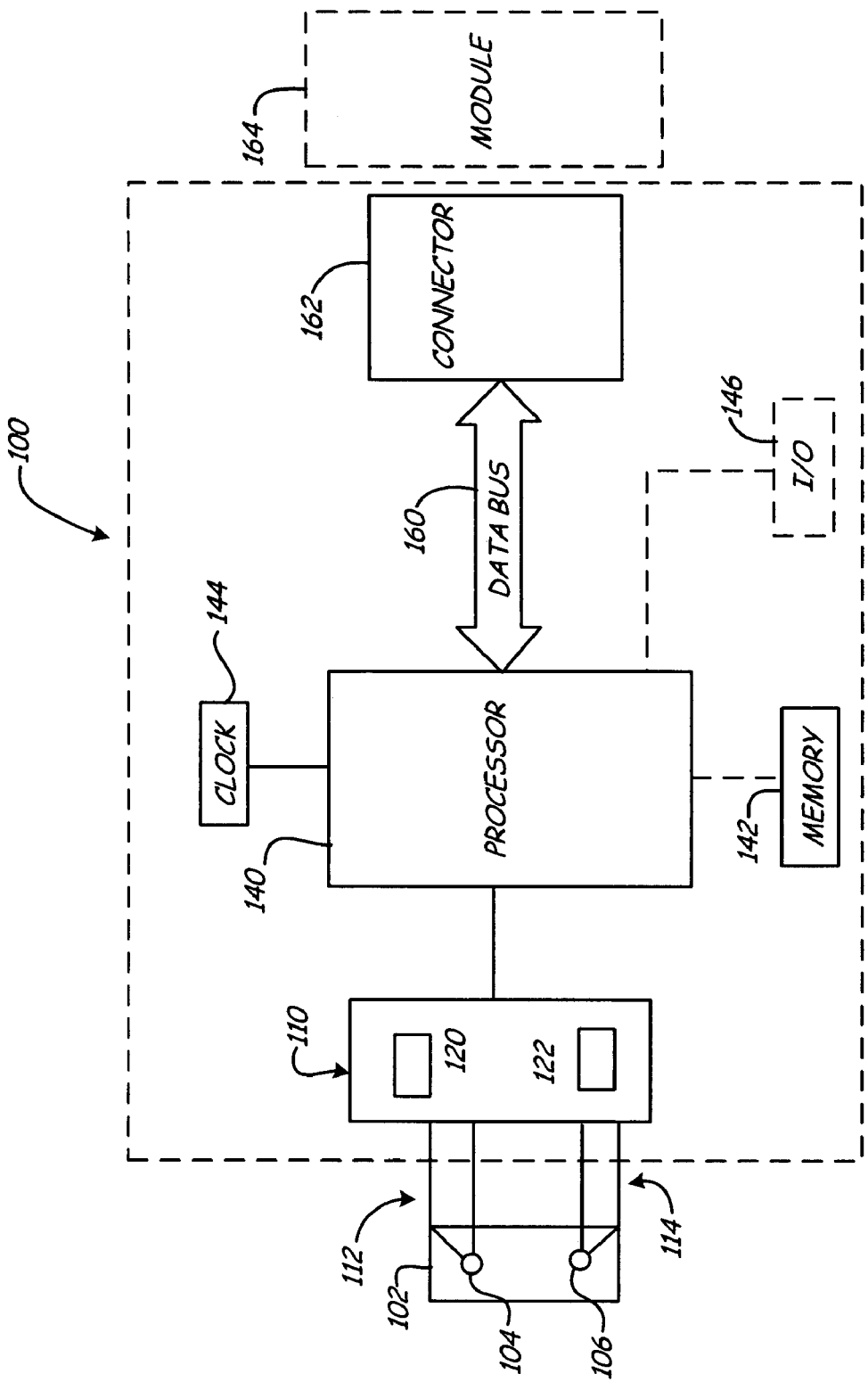
FIG. 1 is a simplified block diagram of a battery tester and a removable module.

FIG. 1 is a simplified diagram of a battery tester 100 configured to test a storage battery 102. Storage battery 102 includes terminals 104 and 106 and may comprise a single cell or a plurality of cells. Battery tester 100 includes battery test circuitry 110 which electrically couples to battery 102 to terminals 104 and 106 of battery 102 through Kelvin connections 112 and 114, respectively. In one aspect, the connection between test circuitry 110 and battery 102 can be through any appropriate means and is not limited to Kelvin connections. For example, a split Kelvin configuration, non-Kelvin connections and/or current sensors can be used. In one specific embodiment circuitry 110 includes a forcing function source 120 configured to apply a forcing function signal to battery 102 through Kelvin connections 112 and 114. In such an embodiment, circuitry 110 may also include a response sensor 122 electrically coupled to battery 102 through Kelvin connections 112, 114. The response sensor 122 is configured to sense an electrical response of battery 102 to the applied forcing function signal. The forcing function signal includes a time varying component and can be applied either by injecting a signal or selectively applying a load to the battery 102.

A digital processor 140 is electrically coupled to circuitry 110 and is configured to test the storage battery 102. Processor 140 operates in accordance with instructions stored in some type of a memory 142 and at a rate determined by clock 144. In one specific embodiment, processor 140 measures a dynamic parameter of battery 102. An optional input/output (I/O) 146 is provided for coupling to other equipment and/or for operation by a user.

In accordance with the present invention, a data bus 160 is provided which couples processor 140 to a connector 162. The data bus 160 can carry digital or analog data along with analog signals or electrical power as desired. Connector 162 is configured to couple to a removable module 164 which can be selectively coupled to battery tester 100 to add functionality to battery tester 100.

Figure 2:
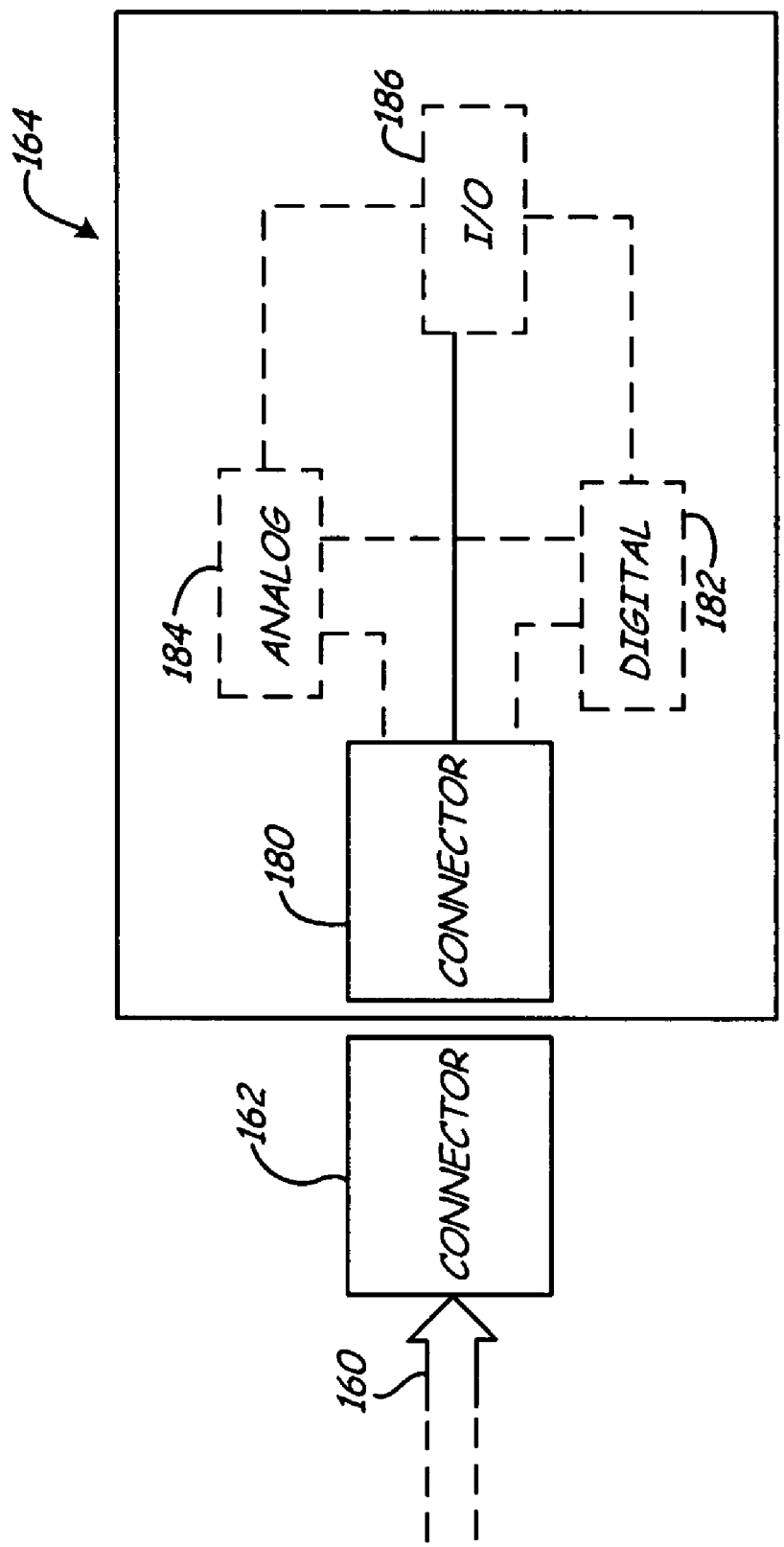
FIG. 2 is a more detailed block diagram of the removable module shown in FIG. 1.

FIG. 2 is a simplified block diagram of one example of a removable module 164 and shows various component blocks which can be included in module 164. Module 164 includes a connector 180 configured to mate with connector 162 of battery tester 100 and thereby provide a connection to data bus 160. In one aspect, optional digital circuitry 182 is provided and coupled to data bus 160 through connectors 180 and 162. Similarly, in another example aspect, optional analog circuitry 184 is provided and can also couple to data bus 160 through connectors 180 and 162. Another optional circuit is illustrated as input/output circuit 186 which can couple to data bus 160 through connectors 180 and 162. Removable module 164 can include any combination of circuits 182, 184 and 186. Further, these circuits can optionally interconnect with one another.

Figure 3:
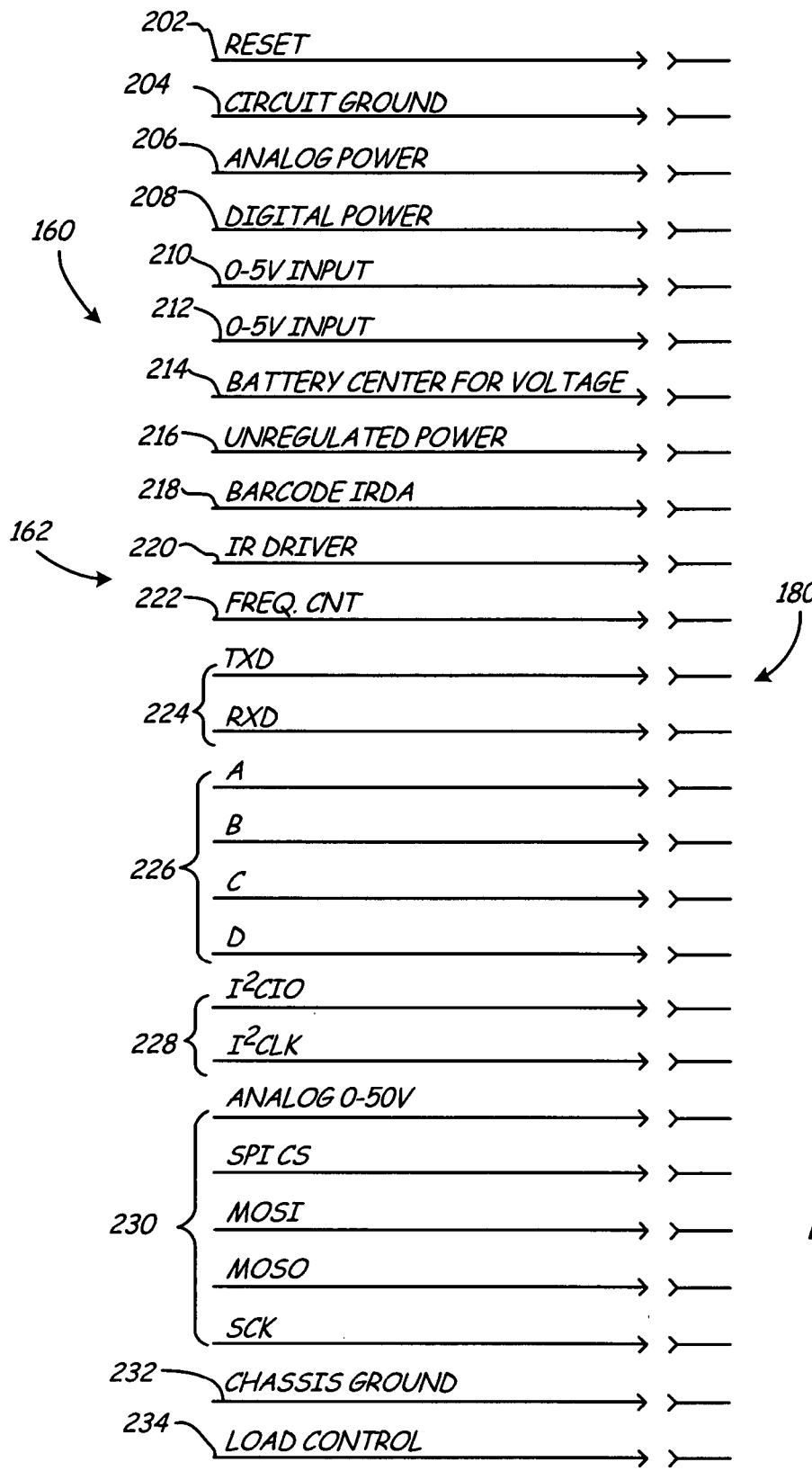
FIG. 3 is an electrical schematic diagram showing electrical lines or connections in the connector which couples the battery tester to the removable module illustrated in FIG. 1.

FIG. 3 is a electrical diagram showing specific electrical connections provided in one embodiment of connectors 162 and 180. These connections are shown for example only and the present invention is not limited to this particular configuration. The electrical connections shown in FIG. 3 form the data bus 160 illustrated in FIGS. 1 and 2.

A reset connection 202 carries a reset signal between battery tester 100 and module 164 such that either unit can cause a reset to occur in the other. This is useful if one of the units is not responding. Line 204 carries a circuit ground while lines 206 and 208 carry analog and digital power, respectively, from the battery tester 100 to the module 164. Lines 210 and 212 provide analog inputs from module 164 to battery tester 100. In a specific example, these inputs can range between 0 and 5 and can be configured to represent a variable in an analog format. Line 214 carries a battery center voltage connection and is used to couple to a center terminal of a multi-terminal battery. Unregulated power is provided on line 216. A bar code/IRDA connection is provided on line 218 and an IR driver connection is provided on line 220. The bar codes/IRDA connection can be used to receive data from module 164 and the IR driver line 220 can be used to send data to an external device, such as a printer, through module 164.

A frequency count line 222 is provided for transferring data relating to frequency. TXD and RXD lines are provided on a serial connection 224 for transferring data serially between module 164 and battery tester 100. Connectors 226 provide a connection through Kelvin connectors 112 and 114 and are identified as A, B, C and D. This allows module 164 to have direct access to the Kelvin connectors 112 and 114.

A two-line data bus connection 228 is provided in accordance with the I$^2$C standard for bi-directional communication between battery tester 100 and module 164. Additionally, five lines are provided for a data bus 230 which operates in accordance with the SPI standard for data communication between battery tester 100 and module 164. A chassy ground is provided on line 232 and a load control is provided on line 234. Load control line 234 is used to control application of a load contained in module 164.

The example data bus 160 shown in FIG. 3 provides a number of different electrical connections for sending signals between tester 100 and module 164. Depending on the particular signal lines being employed, tester 100 and module 164 should be configured appropriately. For example, if a serial bus 224 is used, processor 140 of battery tester 100 and digital circuitry 182 from module 164 should have appropriate circuitry to interface with such a serial connection.

In one embodiment, module 164 comprises a standard battery tester interface. For example, such an interface can provide a direct passthrough connection with no electronics itself and a standard battery interface is built into the main tester body.

In another example, module 164 comprises a 42 volt battery tester interface. In such an embodiment, the interface can provide voltage and/or conductance scaling by adjusting amplifiers and/or divider networks to scale a 42 volt input voltage, or other measurements such that they can be used with a standard battery tester interface. This allows a single test circuit to be used with differing battery types by scaling applied signals and/or measured values. This is not limited to the measurement of 42 volt batteries and can be applied to other battery sizes. In general, the battery test module can include circuitry which can scale a measurement.

Module 164 can comprise a hybrid vehicle interface. For example, instead of scaling a 42 volt battery voltage, a much high voltage can be scaled such as those present in hybrid vehicles, for example 250 to 400 volts.

Module 164 can comprise an OBDII connector such that battery tester 100 can access the OBDII data bus of a vehicle. In another example, module 164 comprises a multimeter to thereby add such functionality to battery tester 100. In such an example, Kelvin connectors 112 and 114 can be used to provide signals to module 164 through connection 226. The signals can be digitized using digital circuitry 182. This information is provided back to processor 140 and displayed or output on I/O 146. For example, voltage resistance or current can be measured. In a similar example, module 164 provides an oscilloscope function.

Communication functions can be provided through module 164 such as radio frequency or infrared and other wired or wireless communication I/O. For example, module 164 can provide an interface to a printer. In another example, module 164 includes a printer such that information can be printed directly.

Module 164 can include a memory which carries specific software to add additional software functionality to battery tester 100. Data security, encryption or software unlocking keys can also be provided by a memory in module 164.

Module 164 can include calibrated values such that specific calibrations can be performed on battery tester 100. For example, a calibration reference can be coupled to the tester 100. The value of the reference can be digitally communicated to the tester 100.

Module 164 can include additional processing circuitry to further process battery test data.

In one embodiment, analog circuitry 184 includes a large resistive load which can optionally be applied to battery 102 during a test. The load is configured to draw a large amount of current for performing a load test.

Removable module 164 can also provide a backup battery connection for operating circuitry of battery tester 100. A barcode reader can be included in module 164 such that module 164 can be used to read bar code information, for example on a vehicle or on a battery. This information can be used by the battery tester 100 or stored for future use. A data port can be included in module 164, such as a USB port or a PCMCIA port. This allows the battery tester 100 to couple to widely available modular devices used with personal computers. The module 164 may contain additional memory for storage or data logging or a real time clock.

Module 164 can also contain circuitry or stored algorithms for performing additional tests such as testing the alternator of a vehicle or the starter, etc.

Figure 4A:
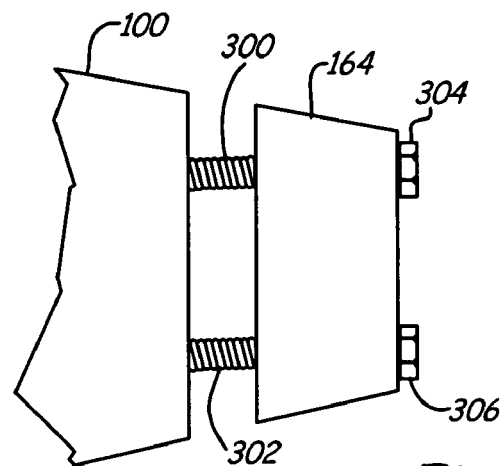
FIGS. 4A, 4B and 4C show couplings between the battery tester and removable module.
Figure 4B:
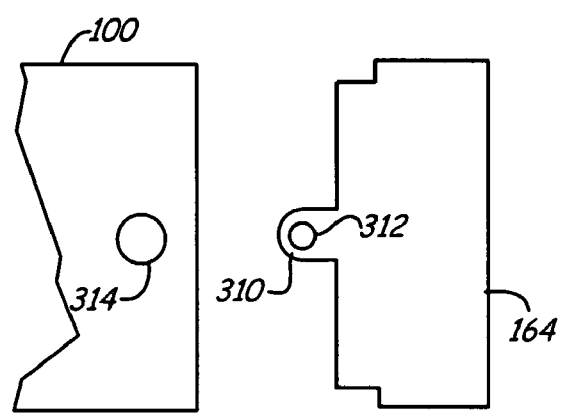
Figure 4C:
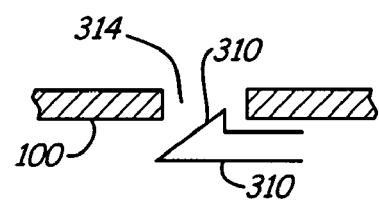

Removable module 164 can be coupled to measure battery tester 100 using any appropriate technique. For example, FIG. 4A is a side view showing battery test module 164 coupling to battery tester 100 through screws 300 and 302. Finger grips 304 and 306 can be used to manually tighten the screws 300, 302, respectively, by an operator. FIG. 4B is a side view shown another attachment technique in which a spring loaded members 310 includes a protrusion 312 which fits into a receptacle 314. A more detailed view is shown in the cross-sectional view of FIG. 4C. Other attachment techniques include separate screws or attachment elements, snap fit techniques, etc. The mechanisms can be separate elements, molded into the cases of battery tester 100 and/or removable module 164, etc.

In one configuration, the module 164 is used to provide any number of different types of secondary functionality to the battery tester 100. The module 164 can be removably coupled to a connector, or can be spaced apart from the battery tester and communicate using wireless techniques, or can be contained internally to the tester 100.

In one specific configuration, the module is used to measure various parameters of tires of a vehicle. For example, the module 164 can include a depth gauge used to determine remaining life of tires. The depth gauge can be mechanical, optical or use other techniques. The module can also include an air pressure gauge which is coupled to a valve of the tire to provide an electrical output. In some newer vehicles, tire pressure sensors are carried with the tire and provide a wireless output, such as a RF signal. In such a configuration, the module 164 can be configured to receive the tire pressure information over the wireless connection.

Other example sensors which can provide secondary functionality include a brake pad wear sensor, a brake rotor wear sensor, a fluid level sensor, an exhaust emission sensor, temperature sensors, etc. In various configurations, the sensors can either plug into the battery tester 100, be built into the tester, be wired to it by a cable, or communicate wirelessly using, for example, infrared or radio frequency. In one configuration used for measuring parameters of a tire, the sensor can include a means to encode which tire is being read. For example, buttons can be used to indicate left front, right front, left rear and right rear tire of the vehicle so that the readings can be correlated to the correct tire pressure. The data may be merged with battery data or be used independently. In another example, the data can be encoded into an audit code. In such a configuration, the data is encoded in a manner to reduce fraudulent manipulation of the data. The data can be stored locally, for example on a temporary memory such as a flash card, or can be transmitted to a remote location such as a point of sale. Example transmission techniques include wireless techniques such as infrared or radio frequency, and any appropriate protocol including for example, TCP/IP.

The data read back from the sensor can be compared against limits and used to trigger alarms. The limits can be based upon the type of vehicle being examined or based on other criteria. Additionally, data collected following maintenance can be compared with data collected prior to performing maintenance. For example, vehicle information can be stored in a memory which relates to the proper tire inflation pressure(s) for a specific vehicle or tire. The vehicle type can be input using, for example, a manual input or the like. The stored data can be in the form of a simple look-up table. In addition to the tire pressures being based upon vehicle type, the specific type and manufacturer of a tire can also be used and data stored related to proper tire inflation.

In vehicles which include circuitry for monitoring tire pressures, and where the tire pressures must be different between the front and the back tires, the test system must be able to identify which pressure data came from which tire. In another aspect of the present invention, the tester 10 can communicate with circuitry in the vehicle to correlate where each of the pressure sensors are located. This is important, for example, if the tires are rotated. The communication to circuitry in the vehicle can be through, for example, an onboard data bus connection such as OBDII.

Various types of tire measurement instruments have been used. These include an electronic pressure gauge with a digital readout, a mechanical tread depth gauge, an electronic tread depth gauge, for example, using a laser. In one aspect, the present invention provides a combination mechanical tire pressure sensor and mechanical tire depth gauge, or a combination digital pressure sensor and mechanical depth gauge.

In one aspect, the present invention includes a combined tire pressure and tire temperature measurement test device, a combined electronic pressure and electronic tread depth gauge test device, or a combined temperature, pressure and depth gauge, any of which may or may not include the ability to print or wirelessly communicate. For example, such a tester can wirelessly communicate with a RF equipped battery tester, and/or can print wirelessly using, for example, an infrared communication link to a printer. The tire tester can include an air pressure sensor for coupling to a valve stem on a tire. Examples of electronic tread depth sensors include a spring-loaded shutter that selectively uncovers sequencing LED's or a light sensor detects which LED's are exposed and converts this information to depth. An infrared temperature sensor can be used to measure the side wall temperature of a tire which can then be used to properly interpret the tire pressure data.

In a configuration in which the tire tester includes a user output, instructions can be provided to step the operator through the various tires of the vehicle, for example, left front, right front, right rear and left rear. In another example, if user input is provided, the operator can provide an indication of which tire is being tested. A user input can also be used to initiate a particular test. Tests can be selected individually, or an automatic sequence can be initiated which steps an operator through the various tests. Collected data can be stored within the tire tester, or can be communicated remotely using wired or wireless communication techniques. The information can also be provided to a printer. Additionally, the data collected during the testing can be displayed and/or reviewed if the device includes a display. The collected data can also be stored in a non-volatile memory such as an EEPROM for later recovery. In order to conserve battery power, the system can be configured to automatically turn off after a period of nonuse. In order to assist the operator, a light source can be coupled to the device for use in seeing various parts of the tire, for example the valve stem or tread. Units can be selectable, for example English, metric, PSI, kPa, inches and millimeters. In some configurations, the tire tester can wirelessly receive tire pressure data from imbedded pressure sensor carried in some modern vehicles.

Figure 5:
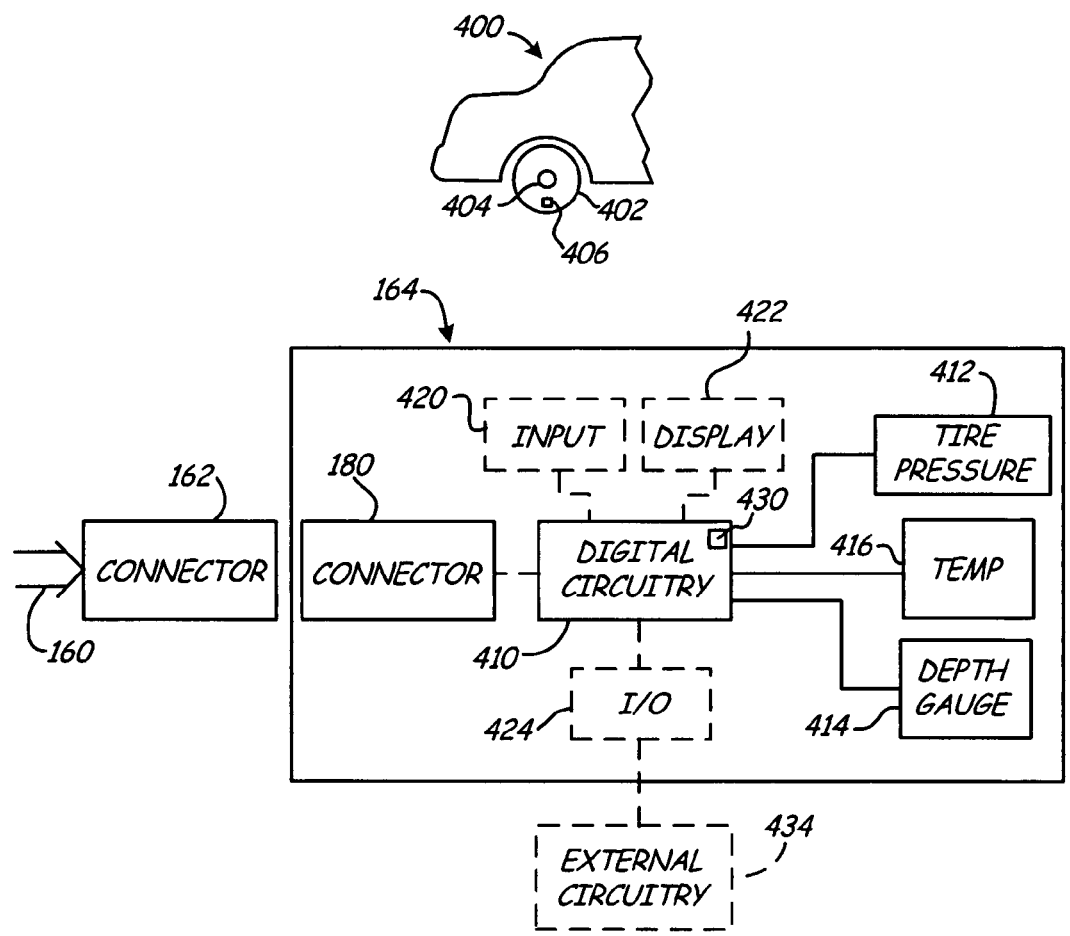
FIG. 5 is a diagram showing a module and an automotive vehicle.

FIG. 5 is a simplified diagram showing module 164 adjacent vehicle 400. Vehicle 400 includes one or more tires 402 which may include a valve 404 for filling tire with air. Tires 402 may also include internal pressure sensors 406 which can wirelessly transmit pressure information. Module 164 is configured for operation as discussed above and includes some type of digital circuitry 410 along with a tire pressure input 412 and/or a tread depth gauge input 414. Tire pressure input 412 and tread depth gauge input 414 can operate using any of the techniques discussed above and can comprise sensors which are directly coupling to tire 402, or can comprise inputs for receiving information either wired or wirelessly. Digital circuitry 410 can comprise any type of digital circuitry and may include a microprocessor or the like.

FIG. 5 also illustrates an optional input 420 and an optional display or other type of output 422. Input 420 can be, for example, a manual input such as a keypad, push button or the like and display 422 can be configured for displaying information locally to an operator. Input/output circuitry 424 is also shown as an option in FIG. 5 and can comprise, for example, circuitry for coupling to a communication network, wired or wireless communication circuitry, etc. The digital circuitry 410 can include memory 430 for containing program instructions for implementing software in accordance with the techniques discussed herein. Memory 430 can also be used for storing other types of information. The input/output circuitry 424 is illustrated as coupling to optional external circuitry 434 which can comprise, for example, other digital equipment including a printer for printing test results. In some configurations, module 164 receives power through connectors 162 and 180. In another example configuration, module 164 includes an internal power source such as a battery. Module 164 can also operate as a standalone device and does not require connection to an external battery tester. In such a configuration, connector 180 is not required. Module 164 also includes an optional temperature input 416 which can comprise, for example, a temperature sensor or an input for receiving temperature information.

Although the present invention has been described with reference to preferred embodiments, workers skilled in the art will recognize that changes may be made in form and detail without departing from the spirit and scope of the invention. In various configurations, module 164 includes no digital circuitry and tire pressure sensor 412 and depth gauge 414 are both mechanical devices. In another configuration, pressure sensor 412 is an electronic device and depth gauge 414 is a mechanical device.

What is claimed is:

1. An electronic vehicle tester, comprising:
   a tire tester for use by an operator to couple to a tire of the vehicle and configured to receive a tire parameter of the tire of the vehicle, the tire tester including, a user input to receive an input from the operator and radio frequency (RF) output configured to wireless transmit the tire parameter;
   an electronic battery tester, comprising;
      first and second Kelvin connections configured to couple to terminals of a battery of the vehicle;
      a forcing function source configured to apply a forcing function to the battery through the Kelvin connections;
      a microprocessor configured to test the battery based upon the response of the batter to the forcing function;
      a memory; and
      a radio frequency (RF) input configured to receive the RF output from the tire tester which contains the tire parameter.

2. The apparatus of claim 1, wherein the tire tester is spaced apart from the battery tester.

3. The apparatus of claim 1, wherein the tire tester includes a tread depth gauge.

4. The apparatus of claim 1, wherein the tire tester includes a tire pressure sensor.

5. The apparatus of claim 1 including an output configured to send data to a printer.

6. The apparatus of claim 1 wherein the user input is configured to receive information identifying the tire undergoing testing.

7. The apparatus of claim 1 including a database configured to couple to the electronic battery tester.

8. The apparatus of claim 1 wherein the tire tester includes a display configured to prompt an operator to test a specific tire of the vehicle.

9. The apparatus of claim 1 including an input configured to receive information related to tire pressure specifications for the vehicle.

10. The apparatus of claim 1 wherein the tire parameter is sent to a point of sale device.

11. The apparatus of claim 1, wherein the tire tester includes a tire temperature sensor.

12. The apparatus of claim 11 wherein a pressure measurement of the tire is adjusted based upon the tire temperature.

13. The apparatus of claim 1, wherein the tire tester includes a receiver configured to receive tire pressure data from a pressure sensor coupled to the tire of the vehicle.

14. The apparatus of claim 13 wherein the receiver is configured to receive tire pressure data over a wireless connection.

15. The apparatus of claim 1 wherein the tire tester includes memory to store data.

16. The apparatus of claim 15 including an output configured to output data stored in the tire tester memory.

* * * * *